US012787627B2

(12) United States Patent
Ferrari et al.

(10) Patent No.: US 12,787,627 B2
(45) Date of Patent: Nov. 3, 2026

(54) PEROVSKITE SEMICONDUCTOR DEVICES

(71) Applicant: CAMBRIDGE ENTERPRISE LIMITED, Cambridge (GB)

(72) Inventors: Andrea Carlo Ferrari, Cambridge (GB); George Kakavelakis, Cambridge (GB); Konstantinos Dimos, Cambridge (GB); Colm O'Riada, Cambridge (GB); Luigi Occhipinti, Cambridge (GB)

(73) Assignee: CAMBRIDGE ENTERPRISE LIMITED, Cambridge (GB)

( * ) Notice: Subject to any disclaimer, the term of this patent is extended or adjusted under 35 U.S.C. 154(b) by 1049 days.

(21) Appl. No.: 17/763,414

(22) PCT Filed: Sep. 25, 2020

(86) PCT No.: PCT/EP2020/076965
§ 371 (c)(1),
(2) Date: Mar. 24, 2022

(87) PCT Pub. No.: WO2021/058775
PCT Pub. Date: Apr. 1, 2021

(65) Prior Publication Data

US 2022/0359824 A1 Nov. 10, 2022

(30) Foreign Application Priority Data

Sep. 29, 2019 (GB) ..................................... 1913835

(51) Int. Cl.
*H10K 71/13* (2023.01)
*C09D 11/52* (2014.01)
(Continued)

(52) U.S. Cl.
CPC ........... *H10K 71/135* (2023.02); *C09D 11/52* (2013.01); *C23C 16/26* (2013.01); *H10F 77/211* (2025.01);
(Continued)

(58) Field of Classification Search
CPC ...... H10K 71/135; H10K 30/40; H10K 30/86; H10K 50/15; H10K 85/10; H10K 85/50;
(Continued)

(56) References Cited

U.S. PATENT DOCUMENTS 9,718,972 B2 8/2017 Torrisi et al.
2012/0199837 A1 8/2012 Kobayashi et al.
(Continued)

FOREIGN PATENT DOCUMENTS

CN 103794374 A 5/2014
CN 104377304 A 2/2015
(Continued)

OTHER PUBLICATIONS

Liu ("Ultrathin and flexible perovskite solar cells with graphene transparent electrodes") Nano Energy vol. 28, Oct. 2016, pp. 151-157 (Year: 2016).*
(Continued)

*Primary Examiner* — Angelo Trivisonno
(74) *Attorney, Agent, or Firm* — McCarter & English, LLP; Yu Lu; James M. Alburger

(57) ABSTRACT

Semiconductor devices comprising: a semiconductor device comprising: a first electrode comprising conductive material, wherein the conductive material is deposited by ink deposition (for example, layered material inks such as graphene and/or graphite), or wherein the conductive material comprises CVD raphe grown graphene or carbon nanotubes; a first charge transportation layer, wherein the first charge transportation layer is doped with the conductive
(Continued)

material of the first electrode; an optional insulation layer; a perovskite active layer; a second charge transportation layer; and a second electrode.

24 Claims, 9 Drawing Sheets

(51) Int. Cl.

| | |
|---|---|
| ***C23C 16/26*** | (2006.01) |
| ***H10F 77/20*** | (2025.01) |
| ***H10K 30/40*** | (2023.01) |
| ***H10K 30/86*** | (2023.01) |
| ***H10K 50/15*** | (2023.01) |
| ***H10K 85/10*** | (2023.01) |
| ***H10K 85/50*** | (2023.01) |
| *H10K 30/50* | (2023.01) |

(52) U.S. Cl.
CPC ............ *H10K 30/40* (2023.02); *H10K 30/86* (2023.02); *H10K 50/15* (2023.02); *H10K 85/10* (2023.02); *H10K 85/50* (2023.02); *H10K 30/50* (2023.02)

(58) Field of Classification Search
CPC .... H10K 30/50; H10K 30/821; H10K 50/155; H10K 85/113; H10K 50/16; H10K 85/1135; H10K 85/151; C09D 11/52; C23C 16/26; H10F 77/211; Y02E 10/549
See application file for complete search history.

(56) References Cited

U.S. PATENT DOCUMENTS

| | | | |
|---|---|---|---|
| 2018/0175222 A1* | 6/2018 | Hayakawa ............ | H10F 77/211 |
| 2018/0312404 A1 | 11/2018 | Karagiannidis et al. | |
| 2018/0358571 A1 | 12/2018 | Choi et al. | |

FOREIGN PATENT DOCUMENTS

| | | | |
|---|---|---|---|
| CN | 105633285 | A | 6/2016 |
| CN | 107732016 | A | 2/2018 |
| CN | 108012568 | A | 5/2018 |
| CN | 108470835 | A | 8/2018 |
| CN | 109216554 | A | 1/2019 |
| EP | 3024042 | A1 | 5/2016 |
| GB | 2501119 | A1 | 10/2013 |
| WO | 2012/156723 | A1 | 11/2012 |
| WO | 2015/166066 | A1 | 11/2015 |
| WO | 2016/083783 | A1 | 6/2016 |
| WO | 2017/001542 | A1 | 1/2017 |
| WO | 2018/124390 | A1 | 7/2018 |

OTHER PUBLICATIONS

Ye (“Efficient and stable perovskite solar cells based on functional graphene-modified P3HT hole-transporting layer”) RSC Adv., 2016, 6, 36356 (Year: 2016).*
Gao Inkjet Printing Patterns of Highly Conductive Pristine Graphene on Flexible Substrates) Ind. Eng. Chem. Res. 2014, 53, 16777-16784 (Year: 2014).*
Saliba (“Incorporation of rubidium cations into perovskite solar cells improves photovoltaic performance”) Science Sep. 29, 2016 vol. 354, Issue 6309 pp. 206-209 (Year: 2016).*
Peng (“Reduce the hysteresis effect with the PEIE interface dipole effect in the organic-inorganic hybrid perovskite CH3NH3PbI3—xClx solar cell”) Organic Electronics 62 (2018) 630-636 (Year: 2018).*
Baranwal (“Fabrication of fully non-vacuum processed perovskite solar cells using an inorganic CuSCN hole-transporting material and carbon-back contact”) Sustainable Energy Fuels, 2018, 2, 2778 (Year: 2018).*
Chu et al., Highly stable carbon-based perovskite solar cell with a record efficiency of over 18% via hole transport engineering. Journal of Materials Science & Technology. Jun. 2019;35(6):987-993.
Acik et al., Graphene in perovskite solar cells: device design, characterization and implementation. J Mater Chem A. 2016;4:6185, 51 pages.
Capasso et al., CVD-graphene/graphene flakes dual-films as advanced DSSC counter electrodes. 2D Mater. 2019;6:035007, 17 pages.
Liang et al., All that glitters is not gold: Recent progress of alternative counter electrodes for perovskite solar cells. Nano Energy. 2018;52:211-238.
Mahmood et al., 16.1% Efficient Hysteresis-Free Mesostructured Perovskite Solar Cells Based on Synergistically Improved ZnO Nanorod Arrays. Adv Energy Mater. 2015;5:1500568, 11 pages.
Qiu et al., Advances and challenges to the commercialization of organic-inorganic halide perovskite solar cell technology. Materials Today Energy. 2018;7:169-189.
Zarabinia et al., Simple and effective deposition method for solar cell perovskite films using a sheet of paper. iScience. Dec. 31, 2021;25(2):103712, 17 pages.
Arora et al., Perovskite solar cells with CuSCN hole extraction layers yield stabilized efficiencies greater than 20. Science. Nov. 10, 2017;358(6364):768-771.
Cheacharoen et al., Design and understanding of encapsulated perovskite solar cells to withstand temperature cycling. Energy & Environmental Science. 2018; 11:144-150.
Cheacharoen et al., Encapsulating perovskite solar cells to withstand damp heat and thermal cycling. Sustainable Energy Fuels. 2018;2:2398-2406.
Das et al., The Role of Graphene and Other 2D Materials in Solar Photovoltaics. Advanced Materials. Sep. 6, 2018;31(1):1802722, 35 pages.
Domanski et al., Not All That Glitters Is Gold: Metal-Migration-Induced Degradation in Perovskite Solar Cells. ACS Nano. Jun. 28, 2016;10(6):6306-14.
Giordano et al., Enhanced electronic properties in mesoporous TiO2 via lithium doping for high-efficiency perovskite solar cells. Nat Commun. Jan. 13, 2016;7:10379, 6 pages.
Grancini et al., One-Year stable perovskite solar cells by 2D/3D interface engineering. Nat Commun. Jun. 1, 2017;8:15684, 8 pages.
Guo et al., Improving and Stabilizing Perovskite Solar Cells with Incorporation of Graphene in the Spiro-OMeTAD Layer: Suppressed Li Ions Migration and Improved Charge Extraction. ACS Appl Energy Mater. 2020;3(1):970-976.
He et al., Reduced-dimensional perovskite photovoltaics with homogeneous energy landscape. Nat Commun. Apr. 3, 2020;11(1):1672, 11 pages.
Kakavelakis et al., Extending the Continuous Operating Lifetime of Perovskite Solar Cells with a Molybdenum Disulfide Hole Extraction Interlayer. Advanced Energy Materials. Jan. 17, 2018;8(12):1702287, 15 pages.
Karagiannidis et al., Microfluidization of Graphite and Formulation of Graphene-Based Conductive Inks. ACS Nano. Mar. 28, 2017;11(3):2742-2755.
Kim et al., Direct p-doping of Li-TFSI for efficient hole injection: Role of polaronic level in molecular doping. Applied Surface Science. Jun. 30, 2019;480:565-571.
Leijtens et al., Stability of Metal Halide Perovskite Solar Cells. Advanced Energy Materials. Sep. 28, 2015;5(20):1500963, 23 pages.
Long et al., Preparation and Characterization of Reduced Graphene-P3HT Composite Thin Films for Use as Transparent Conducting Electrodes. Materials Sciences and Applications. May 2018;9(5):464-472.
Macui et al., Determination of P3HT:PCBM solubility parameters via a binary solvent gradient method: Impact of solubility on the photovoltaic performanced. Solar Energy Materials & Solar Cells. 2012; 100:138-146.
Maniarasu et al., Recent advancement in metal cathode and hole-conductor-free perovskite solar cells for low-cost and high stability: A route towards commercialization. Renewable and Sustainable Energy Reviews. Feb. 2018;82(1):845-857.

(56) References Cited

OTHER PUBLICATIONS

Mei et al., A hole-conductor-free, fully printable mesoscopic perovskite solar cell with high stability. Science. Jul. 18, 2014;345(6194):295-8.
Nrel, Best Research-Cell Efficiency Chart. Retrieved online at: https://www.nrel.gov/pv/cell-efficiency.html. 5 pages.
Oxford PV, Oxford PV perovskite solar cell achieves 28% efficiency. Retrieved online at: https://www.oxfordpv.com/news/oxford-pv-perovskite-solar-cell-achieves-28-efficiency. 4 pages, Dec. 20, 2018.
Petridis et al., Renaissance of graphene-related materials in photovoltaics due to the emergence of metal halide perovskite solar cells. Energy & Environmental Science. 2018;11:1030-1061.
Rosli et al., A review of graphene based transparent conducting films for use in solar photovoltaic applications. Renewable and Sustainable Energy Reviews. 2019;99:83-99.
Saliba et al., Cesium-containing triple cation perovskite solar cells: improved stability, reproducibility and high efficiency. Energy & Environmental Science. 2016;9:1989, 10 pages.
Saliba et al., Incorporation of rubidium cations into perovskite solar cells improves photovoltaic performance. Science. Oct. 14, 2016;354(6309):206-209.
Sherkar et al., Recombination in Perovskite Solar Cells: Significance of Grain Boundaries, Interface Traps, and Defect Ions. ACS Energy Lett. May 12, 2017;2(5):1214-1222.
Wang et al., Efficient ambient-air-stable solar cells with 2D-3D heterostructured butylammonium-caesium-formamidinium lead halide perovskites. Nature Energy. 2017;2:17135, 10 pages.
Ye et al., Solution-processed P3HT-functional graphene for efficient heterojunction organic photoelectronics. Journal of Materials Research. Jul. 13, 2016;13(14):1985-1992.
Zhang et al., Organic Salts as p-Type Dopants for Efficient LiTFSI-Free Perovskite Solar Cells. ACS Appl Mater Interfaces. Jul. 29, 2020;12(30):33751-33758.
Zhou et al., Efficient and stable mixed perovskite solar cells using P3HT as a hole transporting layer. Journal of Materials Chemistry C. 2018;6:5733-5737.
International Search Report and Written Opinion for Application No. PCT/EP2020/076965, dated Mar. 15, 2021, 13 pages.

* cited by examiner

PEROVSKITE SEMICONDUCTOR DEVICES

RELATED APPLICATIONS

This application is a 35 U.S.C. § 371 national stage filing of International Application No. PCT/EP2020/076965, filed on Sep. 25, 2020, which in turn claims the benefit of United Kingdom Patent Application No. 1913835.3, filed on Sep. 25, 2019. The entire contents of each of the foregoing applications are incorporated herein by reference.

The project leading to this application has received funding from the European Union's Horizon 2020 research and innovation programme under the Graphene Flagship grant agreement No 785219 and the Marie Sklodowska-Curie grant agreement No 747381.

FIELD OF THE INVENTION

The present invention relates to perovskite based semiconductor devices. The semiconductor devices include solar cells and light-emitting devices.

BACKGROUND TO THE INVENTION

Perovskite based semiconductor devices have been previously described, for example in WO2015166066, WO2016083783 and WO2017001542. There is significant interest in the use of metal halide perovskite devices due to their high efficiencies for low-cost.

For example, metal halide perovskite solar cells (PSCs) are considered the most promising photovoltaic (PV) technology for low cost power generation due to their high PV efficiency and solution processability. PSC potential is tremendous as halide perovskite semiconductors have complementary absorption spectra compared to silicon (Si), and thus tandem solar cells can be realized by stacking a PSC on top of the Si solar cell, significantly improving in this way the efficiency of the already established Si photovoltaics.

However, there are continuing challenges towards the commercialisation of PSCs, including the low operational stability that these devices present in ambient conditions, the use of expensive components including metallic electrodes (gold or silver) and hole transporting materials (spiro-MeOTAD and PTAA), and the need for high processing conditions including high temperature ultra-high vacuum deposition equipment. These complexities combine to increase the manufacturing cost and complexity and decreases the scalability of device fabrication.

Thus, there remains a need for new perovskite based semiconductor devices to overcome or mitigate some or all of the issues identified above.

SUMMARY OF THE INVENTION

The applicant has found that using particular electrodes together with doped injection layer(s) and a perovskite active layer according to the present invention provides semiconductor devices with enhanced properties.

According to an aspect of the present invention there is provided a semiconductor device comprising:

a first electrode comprising conductive material, wherein the conductive material is deposited by ink deposition (for example, layered material inks such as graphene and/or graphite), or wherein the conductive material comprises CVD grown graphene or carbon nanotubes;

a first charge transportation layer, wherein the first charge transportation layer is doped with the conductive material of the first electrode;

an optional insulation layer;

a perovskite active layer;

a second charge transportation layer;

and a second electrode.

The devices according to the present invention have improved performance over existing devices. Improved performance may be increased efficiency (for example Power Conversion Efficiency or PCE). Improved performance may be increased device stability. Manufacturing devices according to the present invention can reduce production cost thereby leading to overall improvements in device cost effectiveness.

A further advantage of providing the conductive material in both the first electrode and as a dopant in the first charge transportation layer is to enhance the low initial conductivity of the first charge transportation layer (which may be a hole transporting injection layer) and to form a better network for hole extraction from the perovskite active layer.

By avoiding the need for a standard metal electrode yet maintaining sufficient performance levels can improve device scalability and can significantly increase speed of production, for example, by avoiding the need for thermal evaporation process that is required for the metal-based electrodes. By utilising the present invention, for example, printable electrodes can be made with commercially attractive efficiencies and cost.

In a further aspect, there is provided a method of making a semiconductor device comprising applying the first electrode to the device via ink deposition, wherein the ink comprises conducive material dispersed in a solvent, wherein the solvent is selected to be compatible with the perovskite layer, wherein the solvent is selected from IPA, ethanol and ethyl acetate.

Optionally, the first electrode may be a nanoplate electrode which is a printed nanoplate electrode, wherein the nanoplates may comprise microfluidized graphite or graphene. Advantageously, this allows for a low cost and fully-printable method of fabricated a PSC.

By utilising a conductive material dispersed in a solvent (e.g. an ink) to form the first electrode improves device scalability and can significantly increase speed of production, for example, by avoiding the need for thermal evaporation process that is required for the metal-based electrodes. By utilising the present invention, devices based on printable electrodes can be made with commercially attractive efficiencies and cost. The use of specific solvents in the present invention protects the other layers in the device.

In a further aspect there is provided a method of producing a semiconductor device comprising a first electrode, the method comprising doping the charge transportation layer adjacent to the first electrode with conductive material of the first electrode. For example, using a graphene/graphite electrode and doping the adjacent charge transportation layer with graphene/graphite.

Such an approach, improves the efficiency of the device, for example the power conversion efficiency (PCE).

In a further aspect of the present invention, there is provided a semiconductor device comprising: a first electrode; a first charge transportation layer, wherein the first charge transportation layer is doped with conductive material of the first electrode; an insulation layer; and a perovskite active layer. It has been found that this combination has particularly advantageous properties, both in terms of efficiency and stability.

In a further aspect of the present invention, there is provided a semiconducting device comprising a charge injection layer doped with material used to form the adjacent electrode. Such an approach improves performance of the device.

In a further aspect there is provided a solar cell comprising a semiconductor device according to the present invention.

In a further aspect there is provided an LED comprising a semiconductor device according to the present invention.

DETAILED DESCRIPTION

Figure 1:
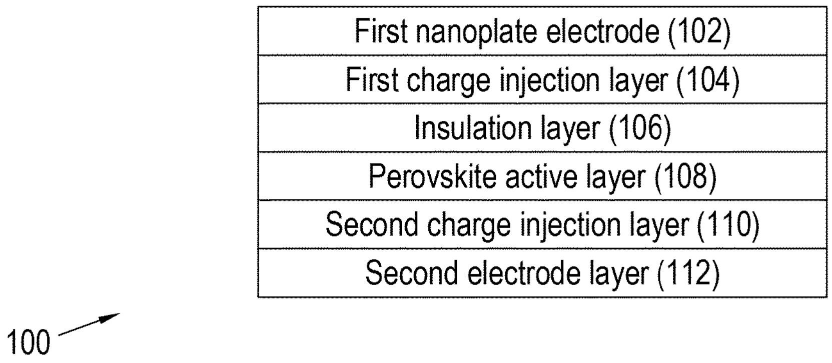
FIG. 1 shows an exemplary device according to the present invention.

The following embodiments apply to all aspects of the present invention. The present invention provides a semiconductor device comprising: a semiconductor device comprising: a first electrode comprising conductive material, wherein the conductive material is deposited by ink deposition (for example, layered material inks such as graphene and/or graphite), or wherein the conductive material comprises CVD grown graphene or carbon nanotubes; a first charge transportation layer, wherein the first charge transportation layer is doped with the conductive material of the first electrode; an optional insulation layer; a perovskite active layer; a second charge transportation layer; and a second electrode.

The term "semiconductor device" may be a solar cell. The semiconducting device may be a light emitting device. The semiconductor device may be a transistor, photodetector, or laser.

In a yet further embodiment, there is provided a solar cell incorporating a semiconductor device as described herein. In a yet further embodiment, there is provided a light emitting device incorporating a semiconductor device as described herein.

The "first electrode" according to the present invention is deposited by ink deposition or comprises CVD grown nanomaterials. Suitable electrodes are deposited by printable conductive inks. Such inks may be perovskite compatible inks, including low temperature processing and solvent compatible.

Suitable conductive materials for use in a printable conductive ink include layered material inks. Suitable layered material inks include graphene, graphite and MXenes.

Layered materials may be nanoplates, including graphite/graphene nanoplates. The first electrode may be a first nanoplate electrode.

Suitable conductive materials for use in a printable conductive ink also include carbon inks (such as carbon black, carbon/graphite, graphite and carbon nanotubes inks).

Suitable conductive materials for use in a printable conductive ink also include metal inks, for example nanowire inks, including silver and copper inks, for example silver and copper nanowire inks.

Once deposited, the first electrode will comprise the conductive material, for example graphene, graphite, carbon nanotubes, silver or copper nanowires and the like.

In an alternative embodiment, the first electrode is not deposited by ink deposition but instead comprises chemical vapour deposition (CVD) grown nanomaterials including graphene or carbon nanotubes.

The first electrode therefore comprises a number of materials, mainly nanomaterials, which have been deposited by CVD but more preferably via ink deposition. Once deposited, the layer forms a suitable electrode.

In a preferred embodiment, the first electrode is a first nanoplate electrode. In a further embodiment, the first electrode is a layered material electrode. In a yet further embodiment, the first electrode is a graphene/graphite nanoplate electrode.

The "first nanoplate electrode" comprises a layered material, including graphite/graphene nanoplates. Generally, individual nanoplates will be understood to comprise a plurality of stacked layers, forming plates, i.e. a structure whose width is greater than its thickness. This may also be referred to as the aspect ratio. A graphite nanoplate may also be defined as 'single/few layer graphene'.

For the avoidance of doubt, the term first nanoplate electrode means an electrode comprising nanoplates. The electrode itself is not nanoscaled but comprises nanoscale material.

Further generally, a nanoplate generally relates to a high aspect ratio structure, i.e. having a length to thickness ratio of greater than around 5. A thickness of an individual nanoplate may be less than around 100 nm and greater than around 500 nm. When formed as an electrode, the nanoplates may form or resemble a nematic structure, i.e. relating to a state in which the nanoplates may generally, or locally, be oriented in parallel but not arranged in well-defined planes (such as layers in bulk graphite).

Graphite nanoplates, which when in a bulk material, or during fabrication, may be referred to as microfluidized graphite, comprise a plurality of layers of stacked graphene. Preferably, this may correspond to a thickness of around 10 nm or less, or around 20 individual stacked graphene layers or less. Most preferably, the layers are pristine graphite and the nanoplates are graphite nanoplates.

Nevertheless, it will be understood that graphene nanoplates may comprise many more, or fewer layers of stacked graphene. Advantageously, graphite/graphene nanoplates with a very small thickness (e.g. single/few layers graphene, less than 10 layers thick), to achieve useful concentrations of only single/few layers graphene are achievable using high pressures (>30 kpsi) during an exfoliation step comprised in the fabrication of the microfluidized graphite.

US 2018/0312404 (the contents of which are hereby incorporated by reference) discloses methods to produce dispersions of layered materials via high shear microfluidic processing. Such layered materials are suitable for use in the present invention.

In a preferred embodiment, the first nanoplate electrode is produced from a conductive ink comprising graphite/graphene nanoplates. Said conductive ink comprises nanoplates dispersed in a suitable carrier liquid.

The nanoplate electrode may be printed from a precursor substance, which may be a dispersion comprising concentrations of graphene nanoplates of around 5 g/L or more in a suitable solution. This forms a viscous paste which allows subsequent printing by e.g. screen and flexo printing, spray coating, doctor blade method, and the like.

Advantageously, the high viscosity provided by the high concentration prevents flocculation (i.e. unfavourable clumping) in the nanoplates. More preferably, the layered material (e.g. graphite nanoplates) is present in the precursor dispersion at a concentration of around at least 10 g/L.

Preferably, conductive inks by processing graphite with a microfluidizer resulting to graphite/graphene nanoplates.

The present invention allows the production of stable nanoplates from a layered material by microfluidization, without the need for stabilizing agents. This allows the production of pure dispersions of high conductivity (sheet resistance below 5 Ohm per square for ~20 μm films) in case of graphite/graphene nanoplates.

Purity and lack of additives allows the application of these dispersions at room temperature or low temperature processing without the need of high temperature processing as annealing for endowing high conductivity, which enables their use on devices where further materials or elements don't withstand elevated processing temperatures, as the case of halide perovskite absorbers and organic hole transporting materials.

Dispersions can have concentrations of 5 g/L or more, forming preferably viscous pastes that can be applied by screen and flexo printing, spray coating and doctor blade method.

In a preferred embodiment, the nanoplates are dispersed in a solvent which is compatible with other layers in the device, such as the charge transport layer(s) or active perovskite layer. The solvent may be selected so that the material used for the charge transport layer is insoluble. The solvent may be selected to be compatible with the perovskite layer. The solvent may be selected to be compatible with the microfluidizer equipment. A suitable solvent is IPA. Further suitable solvents include ethanol and ethyl acetate.

Accordingly, in an aspect of the present invention there is provided a method of manufacturing a semiconductor device having a nanoplate electrode wherein the nanoplate electrode is applied via a conductive ink and the conductive ink uses a perovskite compatible and/or charge transport layer compatible solvent, for example IPA, ethanol and ethyl acetate, most preferably IPA.

For example, the direct microfluidization of graphite in IPA allows the production of stable graphite/graphene nanoplates ink without the need of stabilizing agents (which is beneficial for the low temperature processing needed).

As a further example, P3HT solubility in IPA is <0.1 mg/mg so the injection layer protects all the other layer underneath.

The "first charge transportation layer" may be formed of a semiconducting material. In a further embodiment, the first charge transportation layer may be formed of an organic semiconducting material.

The first charge transportation layers may be a hole transporting organic or inorganic semiconducting material. The material may be selected from the group consisting of PEDOT:PSS, PANI (polyaniline), polypyrrole, optionally substituted, doped poly(ethylene dioxythiophene) (PEDOT).

Organic hole transport materials include Poly(triaryl amines) e.g. PTAA (poly[bis(4-phenyl)(2,4,6-trimethylphenyl) amine]); benzodithiophene (BDT) based polymer; polymer, poly(p-phenylene) PPP; lead phthalocyanine (PbPc); poly (9,9-dioctylfluorene-co-N-(4-(3-methylpropyl)) diphenylamine) (TFB); polythiophene (PT); poly(4,4'-bis (N-carbazolyl)-1,1'-biphenyl) (PPN).

Inorganic hole transport materials include nickel oxide (NiO); copper thiocyanate (CuSCN); copper iodide (CuI); $CuInS_2$ (quantum dots); ternary oxide: $Li_{0.05}Mg_{0.15}Ni_{0.8}O$.

The first charge transportation layer may be small organic molecule HTMs, including spiro OMeTAD; FDT (triazatruxene and others based on the dithiophene core); and PCP-TPA, a triphenyl amine based compound.

The first charge transportation layer may be a hole transporting organic semiconducting material selected from the group consisting of polyfluorenes (preferably F8, TFB, PFB or F8-TFB) or Spiro-OMeTAD or polycarbazole (preferably poly(9-vinylcarbazole)) or 4,4'-Bis(N-carbazolyl)-1,1'-biphenyl, or poly(3-hexylthiophene-2,5-diyl) (P3HT).

In a preferred embodiment, the first charge transportation layer is poly(3-hexylthiophene-2,5-diyl) (P3HT). In a preferred embodiment, the first charge transportation layer is Poly[2,2""-bis[[(2-butyloctyl)oxy]carbonyl][2,2':5',2":5", 2'"-quaterthiophene]-5,5'"-diyl](PDCBT). In a preferred embodiment, the first charge transportation layer is poly[bis (4-phenyl)(2,4,6-trimethylphenyl)amine](PTAA). In a preferred embodiment, the first charge transportation layer is copper thiocyanate (CuSCN). In a preferred embodiment, the first charge transportation layer is Diketopyrrolopyrrole (pDPP5T-2).

More preferably, the first charge transportation layer is P3HT, PDCBT, or CuSCN.

In a most preferred embodiment, the first charge transportation layer is P3HT. In a most preferred embodiment, the first charge transportation layer is PDCBT. In a most preferred embodiment, the first charge transportation layer is CuSCN.

In a preferred embodiment the first charge transportation layer is a doped charge injection layer. In a preferred embodiment, the charge transportation layer is doped with the first electrode material. For example, a device using a graphene/graphite layered material in the first electrode may have a charge injection layer doped with the same layered material.

In greater detail, in a further preferred embodiment, the first charge transportation layer may be a hole injection layer (or more generally a hole transporting material), which is disposed adjacent to the first electrode. The first electrode may comprise graphene/graphite nanoplates and the first charge transportation layer is doped with graphene/graphite nanoplates. Advantageously, the effect of doping the hole injection/transportation layer with graphene is to provide a non-hygroscopic dopant whilst simultaneously achieving a high conductivity.

As mentioned, conventional PSC devices are known to use Li-salts dopants in the hole transportation layers, which are detrimental to solar cell long-term stability, and relatively expensive. Using graphene/graphite nanoplatelets and the like may obviate the need for such Li-salts in hole transportation layers.

Further advantageously, the graphene/graphite nanoplatelets (or microfluidized graphite) or other conductive materials may be printed to form the electrode, which allows for a fully-printable PSC device.

In a preferred embodiment, charge transportation layer is doped with 0.5 to 3%, 0.5 to 2.5%, 1 to 3%, 1 to 2%, 0.5, 1, 1.5, 2, 2.5 or 3%.

In a preferred embodiment, the charge transportation layer is doped with the same material as the first electrode. However, in other embodiments, a different but suitable charge carrying doping material may also be used. In a preferable example, the first charge transportation layer (which may be a hole transporting layer) is doped with a small amount (around 2%) of low concentration (e.g. around 2 mg/ml) microfluidized graphite ink, where the first electrode also comprises a much higher concentration (up to 100% concentration) of the same microfluidized graphite (i.e. graphene nanoplates.) As such, according to the present invention, there is provided a semiconducting device comprising a charge injection layer doped with the electrode material. In a preferred embodiment, the electrode material is graphene/graphite. In a further preferred embodiment, the charge injection layer is a hole injection layer. In a further preferred embodiment, the hole injection layer is P3HT. In a yet further embodiment, the charge injection layer is doped with 0.5 to 3%, 0.5 to 2.5%, 1 to 3%, 1 to 2%, 0.5, 1, 1.5, 2, 2.5 or 3%. In a preferred embodiment, the active layer is a perovskite. In a further preferred embodiment, there is an insulating layer between the active layer and the doped charge injection layer.

The "insulation layer" may be formed of an insulating polymer and is selected from the group consisting of poly (ethyleneimine) (PEI), polyethylenimine-ethoxylated (PEIE), polystyrene (PS), poly(methylmethacrylate) (PMMA) and organic halide salts, for example phenethylammonium iodide (PEAI), Guanidinium iodide (GuI) Guanidinium bromide (GuBr), n-Butylamonium iodide (BAI), n-Butylammonium bromide (n-BABr) and ethylenediammonium diiodide ($EDAI_2$). In a preferred embodiment, the insulation layer is an organic halide salt. In a further preferred embodiment, the insulation layer is phenethylammonium iodide (PEAI).

The insulating layer(s) may be deposited by any suitable means including atomic layer deposition, ALD, spin coating or thermal evaporation etc.

In an embodiment, a thin layer of <30 nm of a material selected molybdenum trioxide and tungsten trioxide is deposited between the electrode and the perovskite layer, between a charge transportation layer and electrode, between the electrode and a charge transportation layer, between the perovskite layer and a charge transportation layer or between the perovskite layer and an electrode.

The "perovskite active layer" may comprise a halide perovskite. The halide perovskite may be an organic metal halide perovskite or an inorganic metal halide perovskite or a hybrid organic-inorganic metal halide perovskite material. The invention is not particularly limited in the choice of perovskite active layer provided it has the desired properties. As such, in embodiments of the invention any suitable perovskite layer may be used. The perovskite may be a 3D perovskite. The perovskite may have lower dimensionality. The perovskite may be a 2D perovskite. The perovskite may be a 1D perovskite. The perovskite may be a quasi-2D perovskite (that is a 2D/3D perovskite).

In embodiments, the perovskite may be an organic metal halide perovskite, and may have an $AMX_3$ structure, where A is a monovalent organic cation or a monovalent metal cation, M is a divalent cation and X is a halide anion.

In an embodiment, A may be a monovalent organic cation or a monovalent metal cation.

A may be dual cationic with an $A_{1-i}B_i$ structure, wherein: A and B are each a monovalent organic cation or monovalent metal cation, where A and B are different; and i is between 0 and 1.

A may be triple cationic with an $A_\alpha B_\beta C_\gamma$ structure, wherein: A, B and C are each a monovalent organic cation or monovalent metal cation, where A, B and C are different; and α, β and γ combined equal 1.

A may be quadruple cationic with an $A_\alpha B_\beta C_\gamma D$, structure, wherein: A, B, C and D are each a monovalent organic cation or monovalent metal cation, where A, B, C and D are different; and α, β, γ and δ combined equal 1.

The monovalent organic cation may be a primary, secondary or tertiary ammonium cation $[HNR^1R^2R^3]^+$, wherein each of $R^1$, $R^2$ and $R^3$ may be the same or different and is selected from hydrogen, an unsubstituted or substituted $C_1$-$C_{20}$ alkyl group and an unsubstituted or substituted $C_5$-$C_{18}$ aryl group. Examples of suitable substituents for the alkyl groups are alkoxy groups having from 1 to 20 carbons atoms, hydroxyl groups, mono and dialkylamino groups wherein each alkyl group may be the same or different and has from 1 to 20 carbon atoms, cyano groups, nitro groups, thiol groups, sulphinyl groups, sulphonyl groups and aryl groups having from 5 to 18 carbon atoms. Examples of suitable substituents for the alkyl groups are alkyl groups having from 1 to 20 carbon atoms, alkenyl and alkynyl groups each having from 2 to 20 carbon atoms, alkoxy groups having from 1 to 20 carbons atoms, haloalkyl groups having from 1 to 20 carbon atoms, hydroxyl groups, mono and dialkylamino groups wherein each alkyl group may be the same or different and has from 1 to 20 carbon atoms, cyano groups, nitro groups, thiol groups, sulphinyl groups and sulphonyl groups.

In embodiments, the monovalent organic cation may be of the form $[R^1R^2N{-}CH{=}NR^3R^4]^+$:

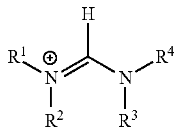

wherein each of $R^1$, $R^2$, R and $R^4$ may be the same or different and is selected from hydrogen, an unsubstituted or substituted $C_1$-$C_{20}$ alkyl group and an unsubstituted or substituted $C_5$-$C_{18}$ aryl group.

In embodiments, the monovalent organic cation may be of the form $(R^1R^2N)(R^3R^4N)C{=}N^4R^5R^6$:

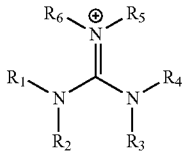

wherein each of $R^1$ $R^2$, $R^3$, $R^4$, $R^5$ and $R^6$ may be the same or different and is selected from hydrogen, an unsubstituted or substituted $C_1$-$C_{20}$ alkyl group and an unsubstituted or substituted $C_5$-$C_{18}$ aryl group.

In embodiments, the monovalent metal cation may be an alkali metal cation.

In embodiments, the monovalent metal cation is caesium ($Cs^+$), rubidium ($Rb^+$) and/or potassium ($K^+$).

In an embodiment, M is a divalent cation.

In a further embodiment, M has the structure $M_{1-j}N_j$ wherein M and N are each a divalent metal cation; and j is between 0 and 1.

In a further embodiment, M has the structure $M_\varepsilon N_\zeta O_\eta$ structure, wherein: M, N and O are each a divalent metal cation, where M, N and O are different; and ε, ζ and η combined equal 1.

The divalent cation M may be a divalent metal cation, such as, but not limited to, tin ($Sn^{2+}$), lead ($Pb^{2+}$), cobolt ($CO^{2+}$) and/or zinc ($Zn^{2+}$).

In an embodiment, X is a halide anion.

In a further embodiment, X has the structure $X_{3-k}Y_k$, wherein X and Y are each a halide anion, where X and Y are different; and k is between 0 and 3.

In a yet further embodiment, X has the structure $X_\alpha Y_\beta Z_\gamma$ structure, wherein: X, Y and Z are each a halide anion, where A, B and C are different; and α, β and γ combined equal 1.

Halide anions may be chosen from chloride, bromide, iodide, and fluoride, and a chalcogenide anion may be chosen from sulphide, selenide, arsenide and telluride.

Preferably, the halide anions may be selected from chloride, bromide, iodide, and fluoride. Preferably at least one of X, Y or Z includes bromide.

All combinations of the above described perovskites are encompassed by the present invention as described above. For example, the perovskite may take the form:

| | A | M | $X_3$ |
|---|---|---|---|
| 1 | A | M | $X_3$ |
| 2 | $A_{1-i}B_i$ | M | $X_3$ |
| 3 | $A_\alpha B_\beta C_\gamma$ | M | $X_3$ |
| 4 | A | $M_{1-j}N_j$ | $X_3$ |
| 5 | $A_{1-i}B_i$ | $M_{1-j}N_j$ | $X_3$ |
| 6 | $A_\alpha B_\beta C_\gamma$ | $M_{1-j}N_j$ | $X_3$ |

-continued

| | A | M | $X_3$ |
|---|---|---|---|
| 7 | A | M | $X_{3-k}Y_k$ |
| 8 | $A_{1-i}B_i$ | M | $X_{3-k}Y_k$ |
| 9 | $A_\alpha B_\beta C_\gamma$ | M | $X_{3-k}Y_k$ |
| 10 | A | $M_{1-j}N_j$ | $X_{3-k}Y_k$ |
| 11 | $A_{1-i}B_i$ | $M_{1-j}N_j$ | $X_{3-k}Y_k$ |
| 12 | $A_\alpha B_\beta C_\gamma$ | $M_{1-j}N_j$ | $X_{3-k}Y_k$ |
| 13 | A | M | $X_\alpha Y_\beta Z_\gamma$ |
| 14 | $A_{1-i}B_i$ | M | $X_\alpha Y_\beta Z_\gamma$ |
| 15 | $A_\alpha B_\beta C_\gamma$ | M | $X_\alpha Y_\beta Z_\gamma$ |
| 16 | A | $M_{1-j}N_j$ | $X_\alpha Y_\beta Z_\gamma$ |
| 17 | $A_{1-i}B_i$ | $M_{1-j}N_j$ | $X_\alpha Y_\beta Z_\gamma$ |
| 18 | $A_\alpha B_\beta C_\gamma$ | $M_{1-j}N_j$ | $X_\alpha Y_\beta Z_\gamma$ |

The perovskites may equally be quadruple cationic and/or ternary metals and the resultant permutations available thereof.

Particularly preferred are triple cationic perovskites. Also preferred are mixed halide perovskites.

The "second charge transportation layer" may be formed of a semiconducting material. In a further embodiment, the second charge transportation layers may be formed of an organic semiconducting material.

The second charge transportation layers may be an electron transporting organic semiconducting material. The material may be selected from the group consisting of poly(fluorene)s, preferably F8, TFB, F8BT or F8-TFB AB copolymer (95:5 F8:TFB).

The electron transporting semiconducting material may be selected from Electron Transport Materials (ETLs) including inorganic ETLs like $TiO_2$; ZnO; $SnO_2$; $ZrO_2$; $SrTiO_3$; $ZnSnO_4$; or $WO_3$. or organic ETLs like PCBM: polystyrene; C60; PEHT; or polyethyleneimine (PEI) or poly(ethylenimine) ethoxylated (PEIE) or 2-Methoxyethanol; PCBM or PCBM:PMMA. The materials may be mesoporous films. Alternatively, the materials may be bulk/compact thin films.

The second charge transportation layers may be an electron transporting inorganic semiconducting material selected from the group consisting of titanium dioxide ($TiO_2$), zinc oxide (ZnO), magnesium zinc oxide (MgZnO) and aluminium-doped ZnO (AZO).

In a preferred embodiment, the second charge transportation layer is a $TiO_2$. In a preferred embodiment, the second charge transportation layer is a ZnO. In a preferred embodiment, the second charge transportation layer is a $SnO_2$. In a preferred embodiment, the second charge transportation layer is a C60. In a preferred embodiment, the second charge transportation layer is a PCBM. In a preferred embodiment, the second charge transportation layer is a $ZnSnO_4$.

In a most preferred embodiment, the second charge transportation layer is a $TiO_2$. In a most preferred embodiment, the second charge transportation layer is a $SnO_2$. In a most preferred embodiment, the second charge transportation layer is a PCBM or PCBM:PMMA.

For the avoidance of doubt, the charge transportation layer(s) described herein (the first and or/second charge transportation layer) may include combinations of the materials outlined above. As an example, an electron transporting layer may comprise ZnO coated with PEIE. Further combinations include compact and/or mesoporous-$TiO_2$ coated with LiTFSI or C60, PCBM, PCBM:PMMA, PCBA, Benzoic acid.

In an embodiment, the device may include a $TiO_2$ electron transporting layer and a spiro MeOTAD hole transporting layer. The device may be a solar cell. In an alternative embodiment, the device may include a ZnO-PEIE electron transporting layer and a TFB hole transporting layer. The device may be a LED.

The "second electrode" may preferably be formed of a transparent, conductive material.

The second electrode may be formed of indium tin oxide (ITO), fluorine doped tin oxide (FTO), indium zinc oxide, graphene, carbon nanotubes and silver nanowires. The electrode may be formed from a metal. A metal could be up to 100-150 nm thick.

An example device according to the present invention is shown in FIG. 1, which shows first electrode (102), first charge injection layer (104), insulation layer (106), perovskite active layer (108), second charge injection layer (110), second electrode layer (112). The first charge injection layer (104) may be a doped charge injection layer. The layer may be doped with the same material as the first electrode, for example, graphene.

Additional layers or regions may be present between each of these regions. For example, an insulation layer may be present between the perovskite active layer and second charge injection layer. However, typically, each region described is in contact with both the preceding and the succeeding region as disclosed herein. The present invention does not exclude the presence of additional layers. Indeed, an advantage of the present invention is that it can be incorporated into, for example, tandem solar cells. For the avoidance of doubt, the present invention describes a number of layers which have been identified as leading to advantageous properties. The invention does not preclude further layers to be present in the device. These further layers may be on either side of the layers described herein. These further layers may equally be between the layers described in the present invention. In this latter embodiment however, the further layers would not negate the technical effect seen with the current layer orientation as described in the present invention.

In an embodiment according to the present invention, the first electrode may have a layer thickness of >1 μm. In an embodiment, the first charge injection layer has a layer thickness of >10 nm. In an embodiment, the insulation layer has a layer thickness of <30 nm. In an embodiment, the active perovskite layer has a layer thickness of >100 nm.

In an embodiment, the electron injecting layer has a layer thickness of >100 nm, for example compact (c-)$TiO_2$>10 nm; mesoporous (m-)$TiO_2$>100 nm. In an embodiment, the second electrode may have a layer thickness of >250 nm.

Figure 2:
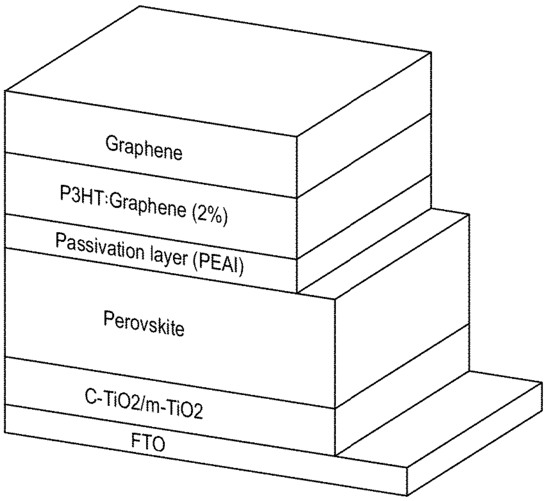
FIG. 2 shows a further exemplary device according to the present invention.

A further example device is shown in FIG. 2. While the graphene is shown in the figure as being doped at 2%, this can be varied as described herein.

In embodiments of the present invention, an interlayer may be present between the first electrode and the first charge transportation layer. The "interlayer" according to the present invention may comprise a conductive material. Alternatively, the "interlayer" according to the present invention may comprise an ultrathin (below 5 nm) insulating film. The interlayer may be deposited by ink deposition or comprises CVD grown nanomaterials. A conductive interlayer may comprise any of the materials that have been described as suitable for forming the first electrode. An ultrathin insulating interlayer may comprise any of the insulating materials defined herein.

In an embodiment, the interlayer may comprise the same material as the first electrode. The interlayer material may be produced from a conductive ink comprising graphite/graphene nanoplates. Said conductive ink comprises nanoplates dispersed in a suitable carrier liquid. The interlayer may be printed from a precursor substance, which may be a dispersion comprising concentrations of graphene nanoplates in a suitable solution. Where the interlayer and the first electrode are both printed from a precursor substance, the concentration of graphene nanoplatelets of the precursor substance from which the interlayer is printed may be lower than the concentration of graphene nanoplatelets from which the first electrode is printed.

The concentration of graphene nanoplatelets of a precursor substance from which the interlayer is printed may be around 0.1 g/L to 5 g/L. Other ranges include 0.2 g/L to 4 g/L, 0.5 g/L to 3 g/L, 0.5 g/L to 2 g/L, 1 g/L to 5 g/L, around 1 g/L, 1 g/L or more.

An interlayer according to the present invention may be deposited by spin-coating.

In an embodiment, the interlayer may have a thickness of between around 2 to 50 nm. In a preferred embodiment, the interlayer may have a thickness of between around 2 to 40 nm, 2 to 30 nm, 5 to 20 nm, 5 to 15 nm or around 10 nm.

An interlayer as described herein may function as a conductive bridge between the first electrode and the first charge transportation layer. Without wishing to be bound by theory, an interlayer as described herein may also act as a scaffold during formation of the first electrode, which may lead to improved uniformity of the first electrode and improve device reproducibility. Inclusion of an interlayer as described herein may enable fabrication of a thinner first electrode in comparison with devices without interlayers without reducing the achievable PCE of the device. For example, it may be possible for the first electrode of a device with an interlayer to have a thickness of less than 5 μm with no loss of PCE compared with a device with a thicker first electrode and no interlayer. Preferably, the first electrode of a device with an interlayer has a thickness of around 10 μm.

In a preferred embodiment, the device may comprise an interlayer as defined herein between the first electrode and the first charge transportation layer, wherein the first electrode has a thickness of less than 25 μm, preferably less than 20 μm, less than 15 μm, less than 12 μm, less than 10 μm, less than 8 μm, less 6 μm, around 1 to 25 μm, around 3 to 20 μm, around 5 to 15 μm, around 7 to 12 μm, around 5 μm, around 6 μm, around 7 μm, around 8 μm, around 9 μm, around 10 μm, around 11 μm, around 12 μm, around 13 μm, around 14 μm, around 15 μm; preferably around 10 μm. The interlayer may have a thickness of between around 2 to 40 nm, 2 to 30 nm, 5 to 20 nm, 5 to 15 nm or around 10 nm.

In embodiments of the present invention, a metal salt or salts with electron accepting (p-type doping) properties salt may be present at one or more interfaces between layers of the semiconductor device. Such devices may exhibit improved performance, including improved fill factors and/or improved PCEs, in comparison with devices without the presence of said metal salt at one or more interfaces between layers. Without wishing to be bound by theory, the improved performance may be due to an improved interfacial contact between layers of the semiconductor device, reduced trap-assisted recombination at the interface(s) and/or increased carrier lifetimes.

According to embodiments, metal salt may be present at an interface between the perovskite active layer and a layer of the semiconductor device adjacent the perovskite active layer, at an interface between the first charge transportation layer and a layer of the semiconductor device adjacent the first charge transportation layer and/or at an interface between the first electrode and a layer of the semiconductor device adjacent the first electrode. For example, the presence of metal salt at an interface may reduce the presence of gaps between layers of a device fabricated according to the present invention.

Metal salt may be introduced into a device fabricated according to the present invention following fabrication of the device. In an embodiment, metal salt may be introduced into the device by applying metal salt to the surface of the first electrode. In an embodiment, metal salt may be introduced into the device by depositing a solution comprising metal salt onto the first electrode. Said solution may comprise metal salt in acetonitrile (ACN). Said solution may be spin casted/infiltrated on top of the first electrode. Alternatively, the salt could be applied by solution processing or thermal evaporation.

Without wishing to be bound by theory, the solution may not penetrate the device further than an interface between the first electrode and the first interlayer or the first charge transportation layer.

It will be understood that depositing salt onto the completed device following device fabrication according to the present invention is not the same as applying salt to each layer of the device during the fabrication process. It will also be understood that a post-fabrication treatment with metal salt according to the present invention may lead to improvements in devices with or without an interlayer.

Any suitable metal salt with electron accepting (p-type doping) properties may be utilised in this embodiment of the invention.

The metal salt may be a lithium metal salt. An exemplary (but not limiting) lithium metal salt is bis(trifluoromethane) sulfonimide lithium (LiTFSI) salt.

The metal salt may be a cobalt metal salt. Exemplary (but not limiting) cobalt metal salts include tris(2-(1H-pyrazol-1-yl)pyridine)cobalt(III) (FK102), tris(2-(1H-pyrazol-1-yl)-4-tert-butylpyridine)cobalt(III) tri[hexafluorophosphate] (FK209) and bis(2,6-di(1H-pyrazol-1-yl)pyridine)cobalt (III)tris(bis(trifluoromethylsulfonyl)imide) (FK269), tris[2-(1H-pyrazol-1yl)pyrimidine]cobalt(II) tri[bis (trifluoromethylsulfonyl)imide](MY11), and bipyridine cobalt complexes.

The metal salt may be a copper metal salt. Exemplary (but not limiting) copper metal salts include CuI, CuSCN, copper (II)-pyridine complexes including bis[di(pyridin-2-yl)methane]copper(II) bis[bis(trifluoromethyl-sulfonyl)imide][Cu $(bpm)_2$] and bis[2,2'-(chloromethylene)-dipyridine]copper (II) bis[bis(trifluoromethylsulfonyl) imide][$Cu(bpcm)_2$], and $Cu(bpcm)_2$.

The metal salt may be a silver metal salt. Exemplary (but not limiting) silver metal salts include AgTFSI. The metal salt may be an iron metal salt. Exemplary (but not limiting) iron metal salts include $FeCl_3$.

Preferably, the metal salt is bis(trifluoromethane)sulfonimide lithium (LiTFSI) salt.

The invention will now be described with reference to the following non-limiting examples.

Materials and Fabrication Techniques

Materials

Unless otherwise stated, all other materials were purchased from Sigma-Aldrich. FTO (TEC7), the precursor solutions for c-TiO2 (Acetyl Acetone and titanium diisopropoxide bis(acetylacetonate)), Li-TFSI powder, P3HT powder and all the solvents used (IPA, ethanol, DFM, DMSO, Chlorobenzene, Dichlorobenzene) were purchased from Sigma-Aldrich. 30 NR-D paste for m-$TiO_2$ layer, the organic salts for the perovskite solution preparation (methylammonium bromide and) formamidinium iodide and PEAI powder were purchased from GreatCell Solar. All the other compounds for the perovskite solution preparation ($PbI_2$, $PbBr_2$ and CsI) were purchased from TCI. The Graphite powder was purchased from Imerys Graphite and Carbon.

Preparation of Nanoplate Electrode Ink

Suitable nanoplate electrode ink was made following the processes described in US 2018/0312404.

Figure 3:
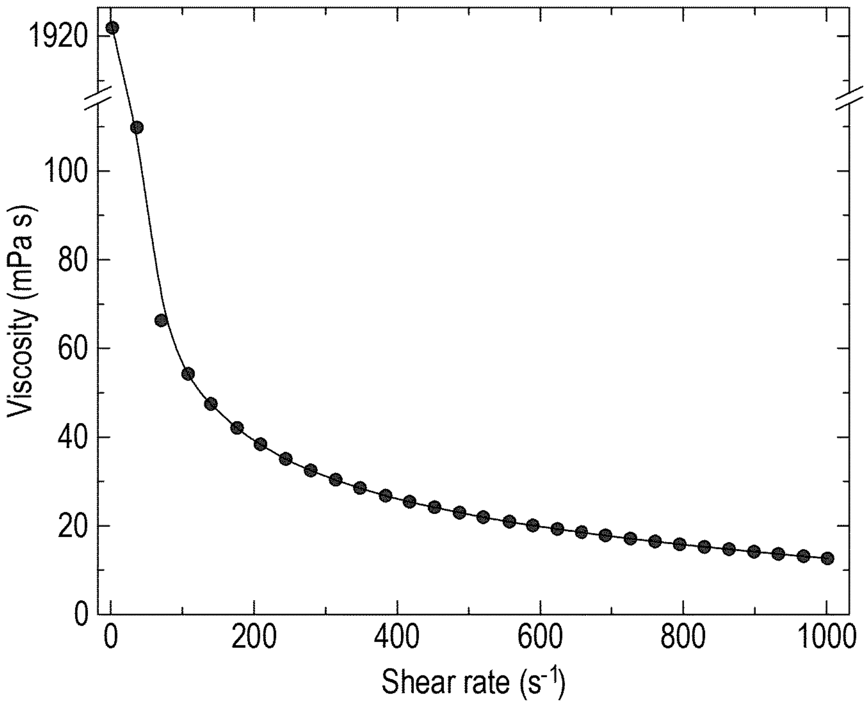
FIG. 3 shows viscosity as a function of shear rate for an ink made according to the present invention.

The high viscosity of the pastes prevents the flocculation of graphite/graphene nanoplates due to complex networking forming metastable colloidal suspensions. This can be seen from FIG. 3, which shows the viscosity as a function of shear rate for an ink made according to the present invention.

Figure 4A:
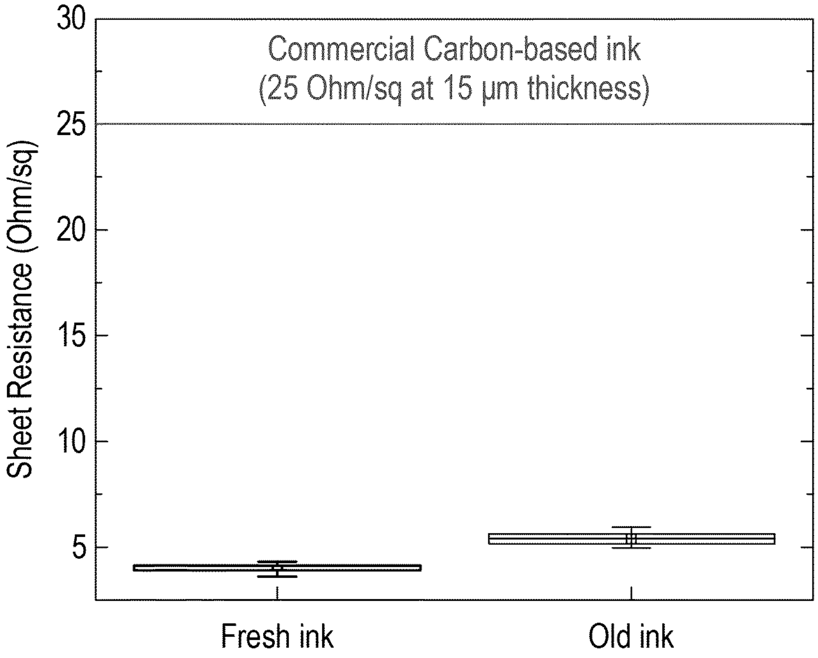
FIG. 4 shows the stability of nanoplate electrode inks over several months.
Figure 4B:
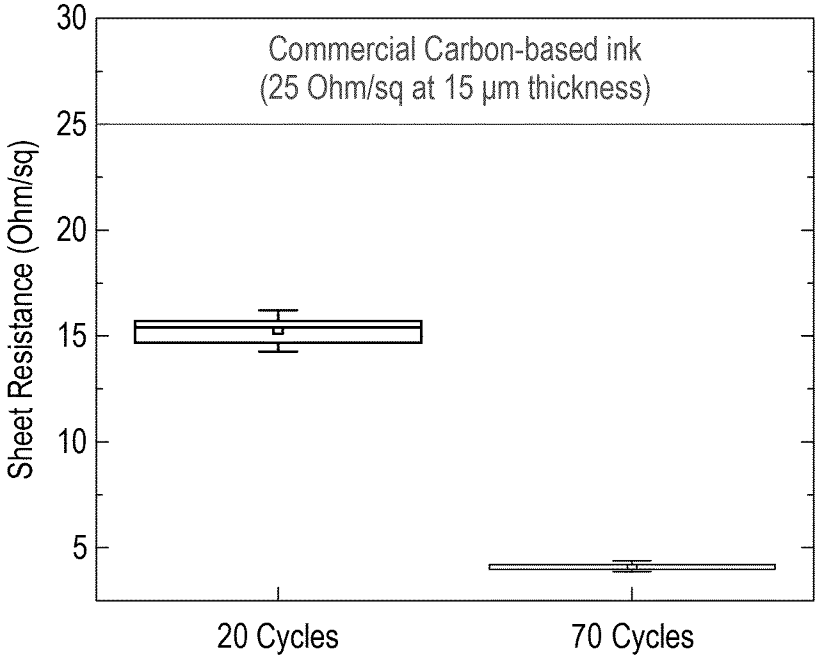

Inks made according to the present invention are stable for several months exhibiting negligible degraded conductivity (sheet resistance slightly above 5 Ohm per square for ~20 μm films) compared to fresh dispersions. This can be seen from FIG. 4. FIG. 4*a* shows a comparison of Sheet resistances for the fresh and old ink-based films. FIG. 4*b* shows the dependence of sheet resistance on the number of microfluidization cycles for fresh samples. Although slightly degraded overtime, the sheet resistance of the aged ink-based film is still significantly lower compared to the commercial carbon ink after sintering at 400° C.

Preferably, dispersions according to the present invention are produced by 10 or more microfluidization cycles, preferably 15 or more, 20 or more, 30 or more, 40 or more, 50 or more, 60 or more, or 70 or more microfluidization cycles.

Figure 5:
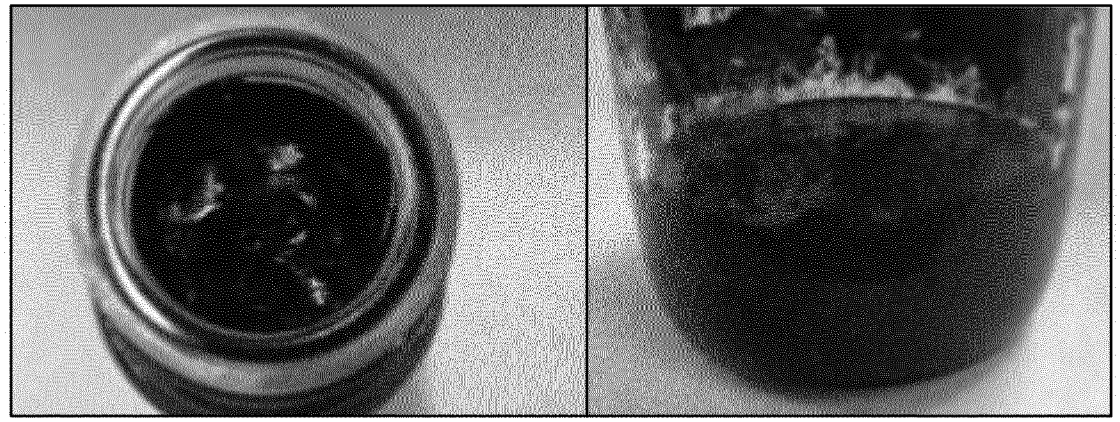
FIG. 5 shows images of fresh ink vs ink which has been stored at room temperature for several months.

Dispersions made according to the present invention can be stored at room temperature for several months. This can be seen from FIG. 5 which shows the long-term stability of graphite/graphene nanoplates inks made according to the present invention. Fresh ink is shown on the left image with old ink on the right.

Preparation of the Graphene Dispersion for Charge Transportation Layer Doping

A small amount (~1 ml) of the as microfluidized graphene ink was dried overnight at 80° C. to ensure the complete evaporation of the solvent (IPA). The as obtained graphene powder was dispersed in dichlorobenzene (DCB) with a concentration of ~2 mg/ml and ultrasonicated inside an ultrasonic bath for ~1 hour. As soon as a homogenous graphene dispersion was obtained, the graphene solution was mixed with Poly(3-hexylthiophene-2,5-diyl) (P3HT) powder at different wt % concentrations. Then Chlorobenzene (CB) was added to the P3HT:Graphene mixture to keep a constant ration between CB and DCB solvents. Finally, the P3HT:Graphene mixture in CB/DCB was ultrasonicated for ~30 minutes to ensure the proper mixing of the blend.

Figure 6:
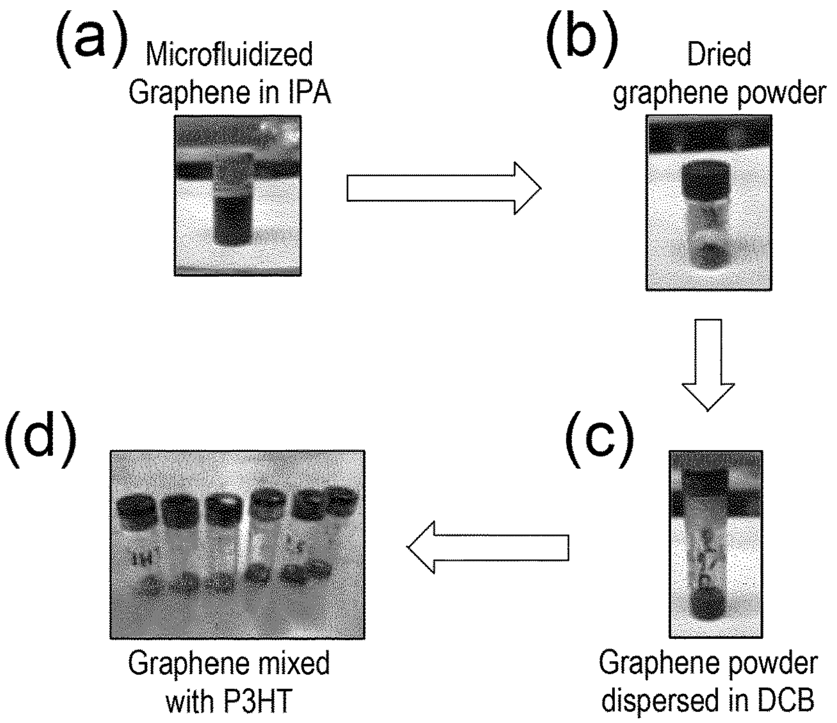
FIG. 6 shows a schematic diagram showing charge transportation layer doping.

A schematic diagram showing charge transportation layer doping is shown in FIG. 6.

In step b), preferably the amount of the ink that is dried should be at least 100 μl to ensure that there is sufficient quantity for the doping process of 1 ml of P3HT solution. The concentration of Graphene in DCB was varied: 0.1, 0.3, 0.5, 0.75, 1, 1.5, 2, and 5 mg/ml.

Different Graphene/P3HT doping ratios were tested and also different DCB/CB ratios were tested (1, 2.5, 5, 7.5, 10, 15, 20 and 25%). The effect of different percentages of doping was investigated using a graphene electrode and a P3HT hole transportation layer doped with varying amounts of graphene. 0% doping resulted in a PV Power Conversion Efficiency (PCE) of 11.5%. Doping the charge transportation layer resulted in the following PCE values: 1% and 2% doping improved PCE to ~13% (2% doping was slightly better). 5% doping had PCE performance ~11.5%, 10% and 15% doping had PCE of ~5%.

In a preferred embodiment, the charge transportation layer is doped with between 0.1 to 5% of the nanoplate material (e.g graphene/graphite). Preferably, the charge transportation layer is doped with 0.5 to 3%, 0.5 to 2.5%, 1 to 3%, 1 to 2%, 0.5, 1, 1.5, 2, 2.5 or 3% of the nanoplate material.

Solar Cell Fabrication

The solar cells were fabricated on Fluorine doped Tin Oxide (FTO) glass substrates (Aldrich, 7 Ohm/sq) patterned by wet etching with zinc powder and concentrated hydrochloric acid. Afterwards, the patterned glass/FTO substrates were cleaned ultrasonically with detergent in DI water, acetone and isopropyl alcohol. The compact $TiO_2$ (c-$TiO_2$) layer was deposited on the preheated at 450° C. glass/FTO substrates by spray pyrolysis. The mesoporous $TiO_2$ (m-$TiO_2$) solution (30 NR-D in ethanol) was spin-coated on top of the c-$TiO_2$ film, followed by a sintering step at 450° C. for 30 minutes. The doping of m-$TiO_2$ was accomplished by spin-coating a 0.1M Li-TFSI solution in acetonitrile followed by an additional sintering step at 450° C. for 30 minutes. See: F. Giordano et al, Nat. Commun. 2016, 7, 10379. After cooling down to 150° C., the samples were transferred inside a nitrogen filled glove box and the triple-cation lead-based mixed halide precursor solution was spin-coated on top of the m-$TiO_2$ layer (using a double spinning program) followed by the anti-solvent quenching step with CB.

Immediately after, to convert the spin-coated precursor film to perovskite, the samples we placed on a hot plate at 100° C. for 60 minutes. See M. Saliba et al, Energy Environ. Sci. 2016, 9, 1989. After cooling the samples down to room temperature, a phenylethylammonium iodide solution was spin-coated on top of the perovskite film, as a thin passivation layer. Subsequently, a P3HT in CB/DCB solution (undoped or Graphene doped at different Wt % concentrations) was spin-coated on top of the PEAI passivated perovskite film. Finally, the devices were completed by doctor blade coating of the microfluidized graphite on top of the P3HT or P3HT:Gr layer. The thickness of the wet microfluidized graphite film was set to 1-1.5 mm, which after the drying process was converted to a ~20 μm thick film. The deposition of the paste was realized in inert atmosphere and immediately afterwards, the samples were annealed for approximately 30 minutes at 80° C. to achieve good interfacial contact between the graphene electrode and the P3HT or P3HT:Gr layer. The devices were left without encapsulation for the characterization tests in ambient conditions.

Characterization of the Devices

The devices were placed under a solar simulator with one-sun light intensity (100 $mW/cm^2$, calibrated using a Si reference cell) and the Current-Voltage Curves were measured using a source meter (Keithley, 2400). The stability tests were conducted in ambient conditions either at room temperature or at 60° C./60% relative humidity inside a Climatic Chamber (Weiss WKL).

Discussion

Figure 7:
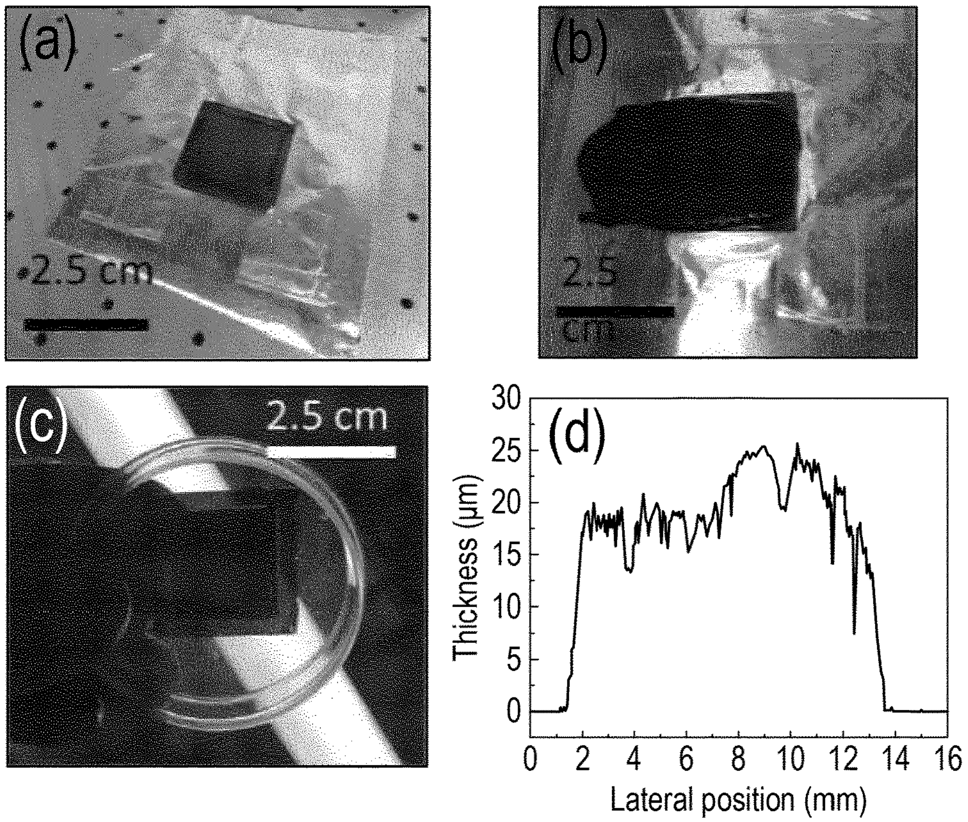
FIG. 7 shows (a) the halide perovskite film on glass, (b) the as blade coated graphene ink on top of the perovskite layer, (c) the perovskite/graphene heterostructure after the curing of the ink in room temperature and (d) the thickness of the as printed and cured microfluidized graphene film.

As it can be seen, the present invention utilises highly conductive (FIG. 4) and stable (FIG. 5) inks that can be cured at room temperature (or preferably low temperatures, i.e. 80° C.) and present significantly lower sheet resistance compared to other similar materials used in PV devices, for example porous carbon-black. In order to test its compatibility with PSC fabrication, ink printability was tested together with resultant halide perovskite stability. The resultant structure during various stages of manufacture are shown in FIG. 7.

By applying (printing) this new ink formulation for the preparation of a microfluidized graphite layer (~20 μm thickness) on top of the perovskite layer, it is possible to avoid degradation of the perovskite layer. This is due to the fact that the ink is processed from a perovskite compatible solvent (isopropyl alcohol) when dried in nitrogen filled glove box and is room-temperature or low temperature (if required) curable.

A process allowing room-temperature curing avoids degradation of the perovskite active layer which is sensitive to high temperature degradation. The present invention therefore allows for low temperature preparation of semiconductor devices by utilising conductive inks based on compatible solvents. For example, devices can be cured at temperatures below 100° C., preferably below 80° C.

Figure 8:
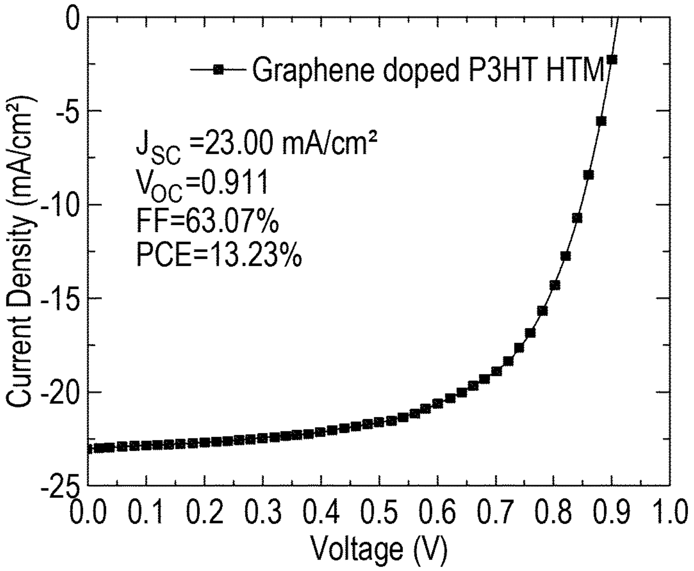
FIG. 8 shows an I-V curve for a device made according to the present invention.

Subsequently, PSCs with the typical mesoscopic architecture were prepared as described herein to produce a device with the following architecture: FTO/c-$TiO_2$/m-$TiO_2$/Perovskite/PEAI/P3HT:Gr/Gr-Electrode). Following the process described above, the microfluidized graphite ink was printed on the samples and then cured at 80° C. to complete the device fabrication. The as prepared PSC with the graphene-based back electrode was then exposed to a solar simulator and the characteristic I-V curves were obtained to calculate the devices photovoltaic performance. The results are shown in FIG. 8 and it can be seen that the device achieves a remarkable PCE of 13.23%.

The optimisation of semiconductor devices according to the present invention achieves, in a PSC, remarkably high PCEs and significantly higher than PCE of ~11.5% achieved in the prior art. This improvement in PCE is due to the use of the features of the present invention and represents around the highest ever reported for a fully printable PSC.

The present invention also leads to a significant reduction in cost due to the printable conditions available for manufacture. This allows for cost-effective scalable processes to manufacture devices according to the present invention. Considering, for example, PSCs, reducing the fabrication costs can ensure the devices become cost effective for energy generation.

Figure 9:
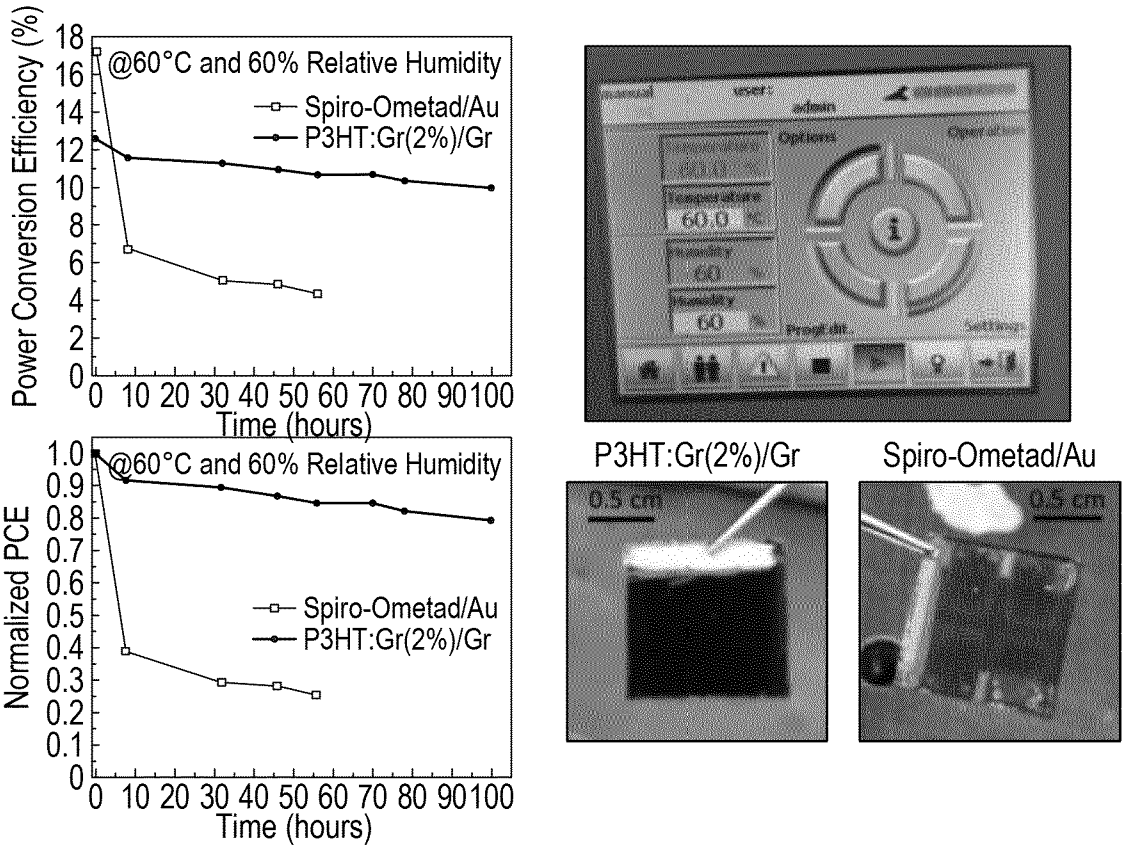
FIG. 9 shows stability tests of PSCs made according to the present invention vs a device with an Au back electrode (exposing the devices without encapsulation in harsh conditions, at 60° C./60% relative humidity).

As well as the advantageous performance and product costs, the devices according to the present invention were also tested to determine their durability. A device according to the present invention (having an FTO/c-TiO2/m-TiO2/Perovskite/PEAI/Spiro-Ometad/Au architecture) is tested against a device comprising a gold electrode and without the doping of hole transporting layer with graphene. These results are shown in FIG. 9, which show stability tests of PSCs. A device according to the present invention comprising a 2% graphene doped P3HT hole injection layer and graphene back electrode made according to the present invention was tested against a similar device comprising a spiro OMeTAD (with Li-doping)/Au device. It can clearly be seen that the devices according to the present invention are significantly more stable compared to the devices with gold electrodes under a 60° C./60% relative humidity stress test. It can also be seen that the device according to the present invention even under these conditions is superior compared to the state-of-the-art standard PSCs (see for example, Domanski et a/ACS Nano, 2016, 10, 6306-6314).

It is important to note that the devices according to the present invention were made without any encapsulation process to prevent oxygen/moisture diffusion within the device. Without wishing to be bound by theory, the thick graphene paste-based film may perform an encapsulation role.

Figure 10:
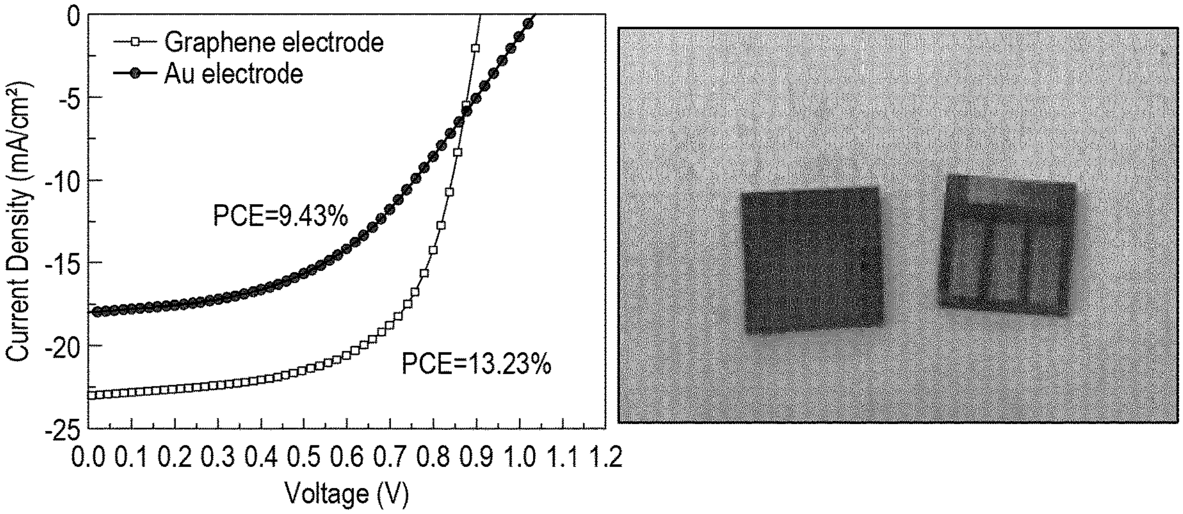
FIG. 10 shows an I-V curve for a device made according to the present invention in comparison with a device which has a gold back electrode but is otherwise identical.

In a further experiment, PCE was evaluated for a device according to the present invention (P3HT:Gr/Gr) against the identical device but using an Au back electrode (P3HT:Gr/Au). The results are shown in FIG. 10. It can be seen that the devices with microfluidized graphite presented significantly higher photovoltaic efficiency compared to Au devices.

Figure 11:
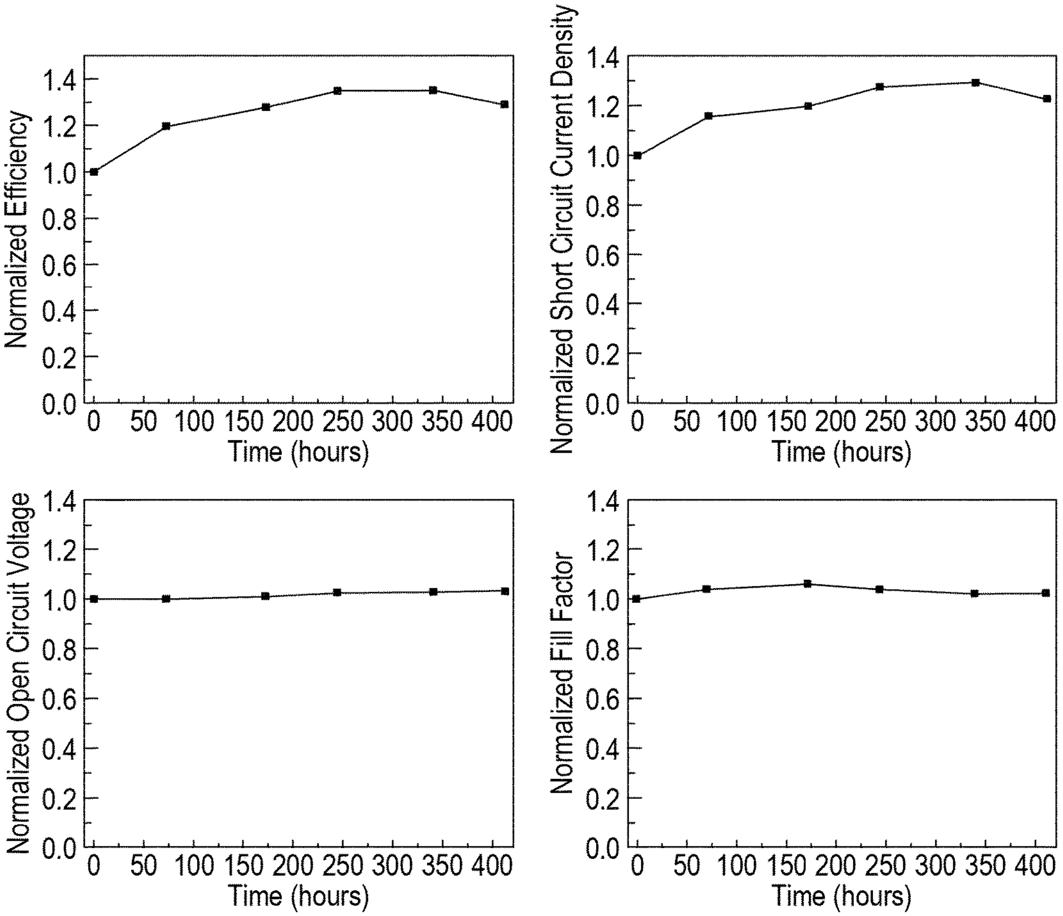
FIG. 11 shows a stability test of a PSC according to the present invention exposing the device in ambient conditions without encapsulation.

In a further experiment, stability of devices according to the present invention were further evaluated. FIG. 11 shows that devices according to the present invention do not degrade over more than 400 hours stability testing (D1 ISOS protocol, self-degradation). Indeed, their efficiency appears to increase.

In conclusion, the present invention has identified semiconductor devices with improved performance. Improved performance may be increased efficiency. Improved performance may be increased stability. The present invention has also identified semiconductor device manufacturing processes that reduce production cost.

The present invention avoids the need for traditionally deposited metal electrodes yet maintains sufficient performance levels. Utilising printable electrodes improves device scalability and can significantly increase speed of production, for example, by avoiding the need for thermal evaporation process that is required for the metal-based electrodes.

By utilising the present invention, devices based on printable electrodes can be made with commercially attractive efficiencies and cost.

The devices in the present invention may be used, for example in PSCs, including perovskite single junction and tandem solar cells.

The present invention simplifies manufacturing complexity for material preparation (less steps for the material production) and provides a low-cost, low-temperature curable and highly conductive electrode material.

Inclusion of an Interlayer

A semiconductor device according to the present invention may include an interlayer between the first electrode and the first charge transportation layer. A non-limiting example of a semiconductor device according to the present invention including a graphene interlayer will now be described.

Graphene Interlayer Ink Formation

Figure 12:
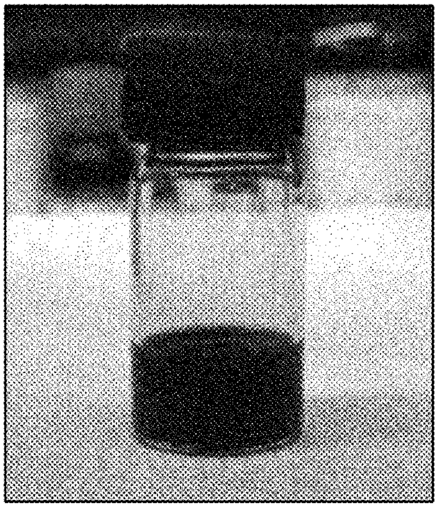
FIG. 12 shows as-prepared graphene interlayer ink with a nanoplates concentration of 1 mg/ml in IPA.

Graphene interlayer ink was prepared using the same ink as that used for the counter electrode described previously. In a first step, a fixed amount of the microfluidized graphene ink was dried overnight at 80° C. Afterwards, the as dried graphene nanoplates powder was dispersed in isopropyl alcohol (IPA) at a concentration of 1 mg/ml. Finally, the dispersion was ultrasonicated for ~15 minutes until the graphene nanoplates powder is well dispersed forming a stable ink (see FIG. 12).

Fabrication of Solar Cells with an Interlayer

Figure 13:
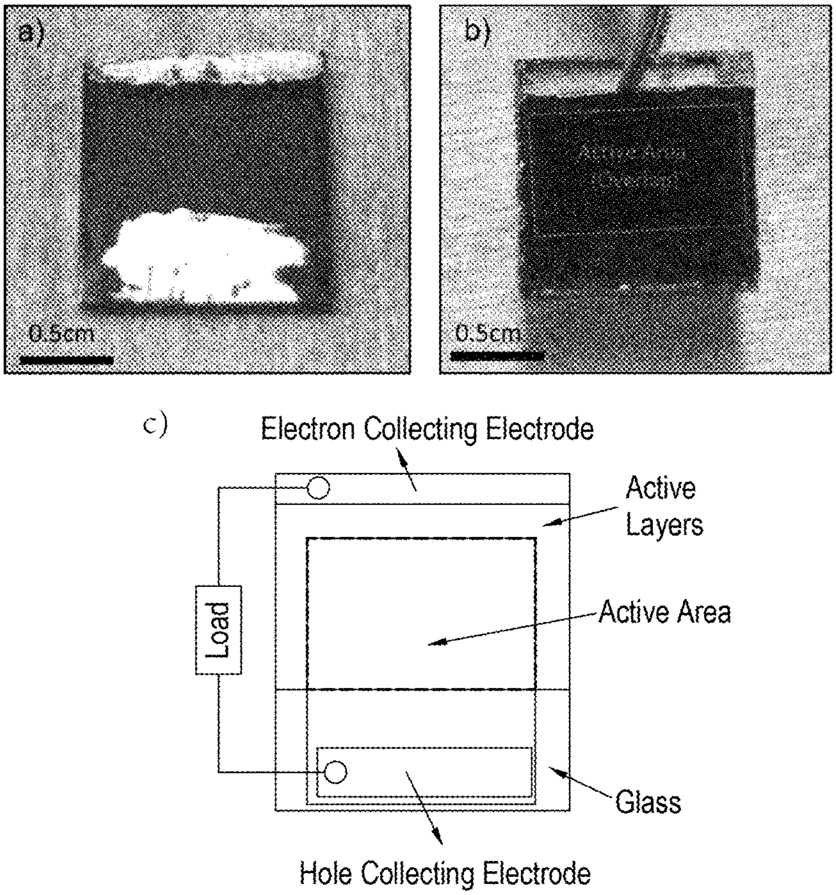
FIG. 13 shows (a) the front side, (b) the back side and (c) a schematic of the front side of a PSC fabricated with a graphene counter electrode according to the present invention.

Heterostructure subcells were fabricated based on the procedures described previously up to the step of formation of the P3HT or P3HT:Gr layer (see: Solar cell fabrication). However, following the formation of the P3HT or P3HT:Gr layer, a graphene interlayer thin film was prepared by depositing (spin-coating) the as-prepared ink on top of the P3HT:graphene hybrid HTL film at 3000 rpm. The devices were subsequently completed by doctor blade coating of the microfluidized graphene ink on top of the graphene interlayer. FIGS. 13*a*, 13*b* and 13*c* show the front, back side and a schematic of the front side of the device, respectively.

The thickness of the wet microfluidized graphene nanoplates film was set to ~0.5 mm, which after the drying process was converted to a ~10 μm thick film. The deposition of the paste was realized in ambient conditions and immediately afterwards, the devices were transferred inside an oven to dry for approximately half an hour at 80° C. The devices were then left overnight without encapsulation inside a dry box.

Discussion

The devices were characterized as described previously (see: Characterization of the devices).

Figure 14:
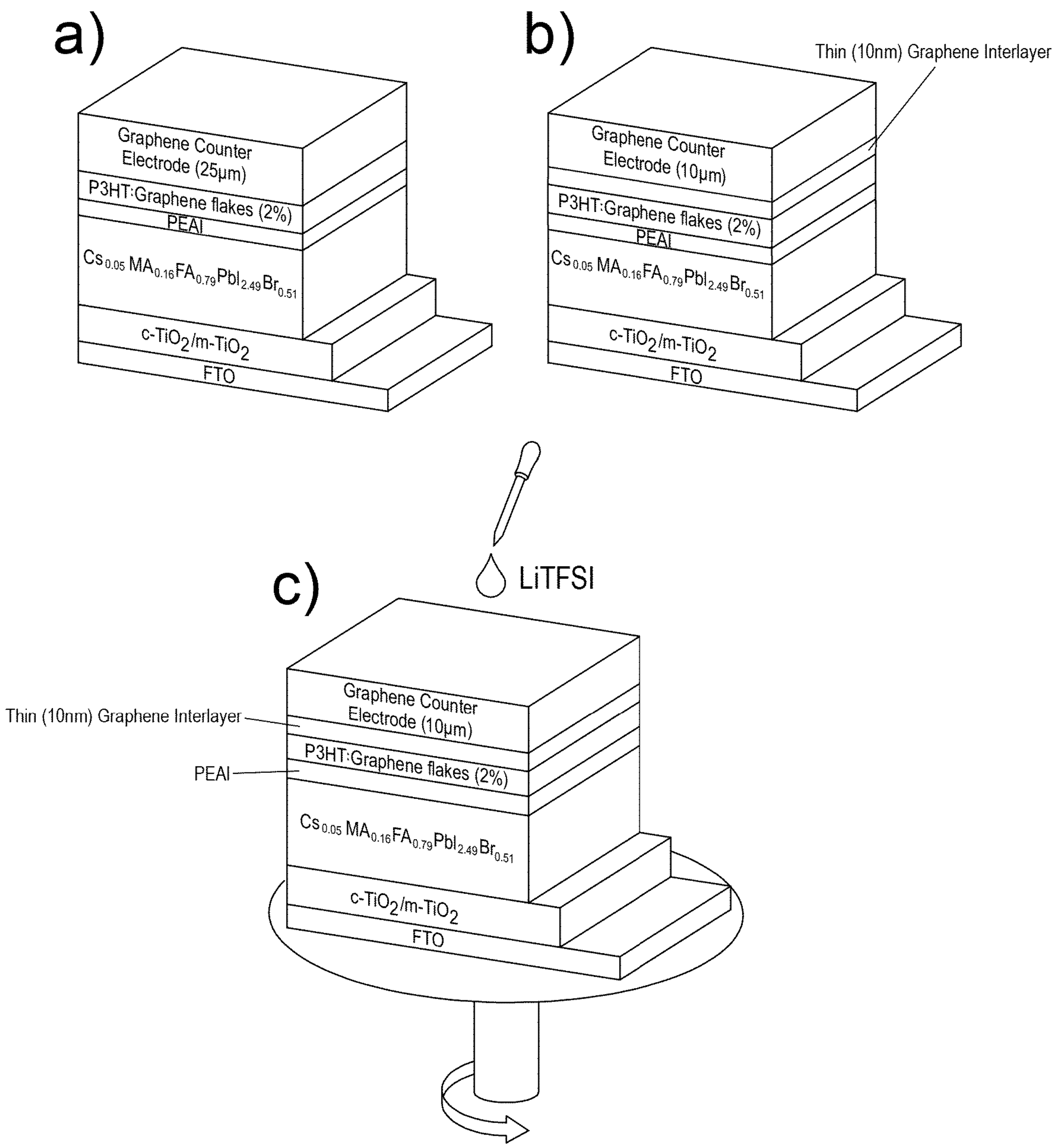
FIG. 14 shows (a) an exemplary device according to the present invention with a 25 μm thick graphene counter electrode, (b) an exemplary device according to the present invention with a graphene interlayer and a 10 μm thick graphene counter electrode and (c) an exemplary device according to the present invention undergoing a post device fabrication treatment with LiTFSI/ACN solution.

FIG. 14*a* shows a schematic of an example of a device fabricated without an interlayer according to the previously described fabrication method (see: Solar cell fabrication).

FIG. 14*b* shows a schematic of an example of a device with a ~10 nm thick interlayer fabricated according to the method described for fabrication of solar cells with an interlayer.

As can be seen, the present invention including a thin (~10 nm) graphene interlayer film (deposited between the counter electrode and the hole transport layer) has a much thinner (~10 μm thick) graphene counter electrode in comparison with the device fabricated without an interlayer (with a graphene counter electrode thickness of ~25 μm). This may be due to the graphene interlayer film acting as a bridge/scaffold for optimum graphene counter electrode deposition. Devices with the thin graphene interlayer and the ~10 μm thick graphene counter electrode exhibited an enhanced fill factor (>64%) in comparison with devices without an interlayer (63%). PCEs of >13% were achieved for the devices with interlayers and ~10 μm thick graphene counter electrodes (see characteristic I-V curve in FIG. 15; "Before Post fabrication LiTFSI treatment"), similarly to the devices with a ~25 μm thick graphene counter electrode. The amount of graphene counter electrode ink needed was therefore reduced by a factor of more than 2 by the inclusion of the graphene interlayer film, while the high PCEs were maintained.

A significant reduction in materials required to produce the graphene counter electrode can therefore be achieved with the present invention by including a thin graphene interlayer film.

Post-Fabrication Treatment

Further improvements in performance of a semiconductor device according to the present invention may be achieved by a post-fabrication treatment of the device with a metal salt. Without wishing to be bound by theory, such a treatment may result in a significant improvement of an interfacial contact between the first electrode and the first interlayer or the first charge transportation layer. The post-fabrication treatment with metal salt may reduce the presence of gaps between layers of the device.

Metal salt may be deposited onto the device by solution processing or thermal evaporation.

It will be understood that depositing salt onto the completed device following device fabrication is not the same as applying salt to each layer of the device during the fabrication process. It will also be understood that a post-fabrication treatment with metal salt may lead to improvements in devices with or without an interlayer.

The post-fabrication treatment may comprise depositing a solution comprising metal salt onto the first electrode. Without wishing to be bound by theory, the solution may not penetrate the device further than an interface between the first electrode and the first interlayer or the first charge transportation layer.

In a non-limiting example, a post-fabrication treatment with LiTFSI salt was applied to the solar cells fabricated with an interlayer as previously described (see: Fabrication of solar cells with an interlayer).

Following the step of being left overnight without encapsulation inside a dry box and after initial I-V characterisation, the devices were placed inside a nitrogen filled glove box and a 20 mM LiTFSI (Sigma-Aldrich) in acetonitrile (ACN) solution was spin casted/infiltrated on top of the graphene counter electrode at 3000 rpm, shown schematically in FIG. 14*c*. Then, the devices were stored again overnight inside a dry box. Finally, the LiTFSI treated devices were measured using exactly the same experimental conditions as before the treatment.

Figure 15:
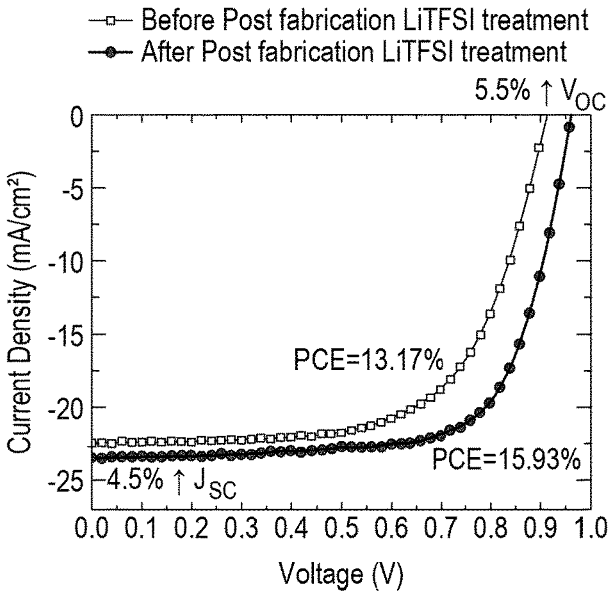
FIG. 15 shows I-V curves of devices fabricated according to the present invention before and after post-fabrication LiTFSI treatment.

FIG. 15 shows a comparison of I-V curves obtained for devices before and after the post-fabrication LiTFSI treatment. As can be seen, the efficiency of the devices after the post device fabrication treatment is reproducibly increased by 3% in absolute value, equivalent to 21% enhancement in PCE compared with the PCE before the treatment. A summary of various photovoltaic parameters (short circuit current, $I_{SC}$; open circuit voltage, $V_{OC}$; FF; PCE) of the different devices prepared and tested in the non-limiting examples described herein is provided in Table 1.

TABLE 1

Summary of photovoltaic parameters of the different devices

| Device | $I_{SC}$ ($mA/cm^2$) | $V_{OC}$ (V) | FF (%) | PCE (%) | % ΔPCE |
|---|---|---|---|---|---|
| No interlayer | 23.00 | 0.911 | 63.07 | 13.21 | — |
| Interlayer | 22.46 | 0.914 | 64.15 | 13.17 | — |
| Interlayer + LiTFSI treatment | 23.46 | 0.963 | 70.44 | 15.93 | +20.9 |

All of the photovoltaic parameters were increased in the devices fabricated according to the present invention following the LiTFSI treatment, with $I_{SC}$, $V_{OC}$ and FF reaching ~23.5 $mA/cm^2$ (increased by 4.5%), ~0.96V (increased by 5.5%) and ~70.4% (increased by ~10%) respectively (see Table 1) in comparison with the same devices prior to the LiTFSI treatment. The maximum efficiency for a device fabricated according to the present invention of ~16% is one of the highest (if not the highest) ever reported of any monolithic integrated fully printed PSC with HTL.

Figure 16:
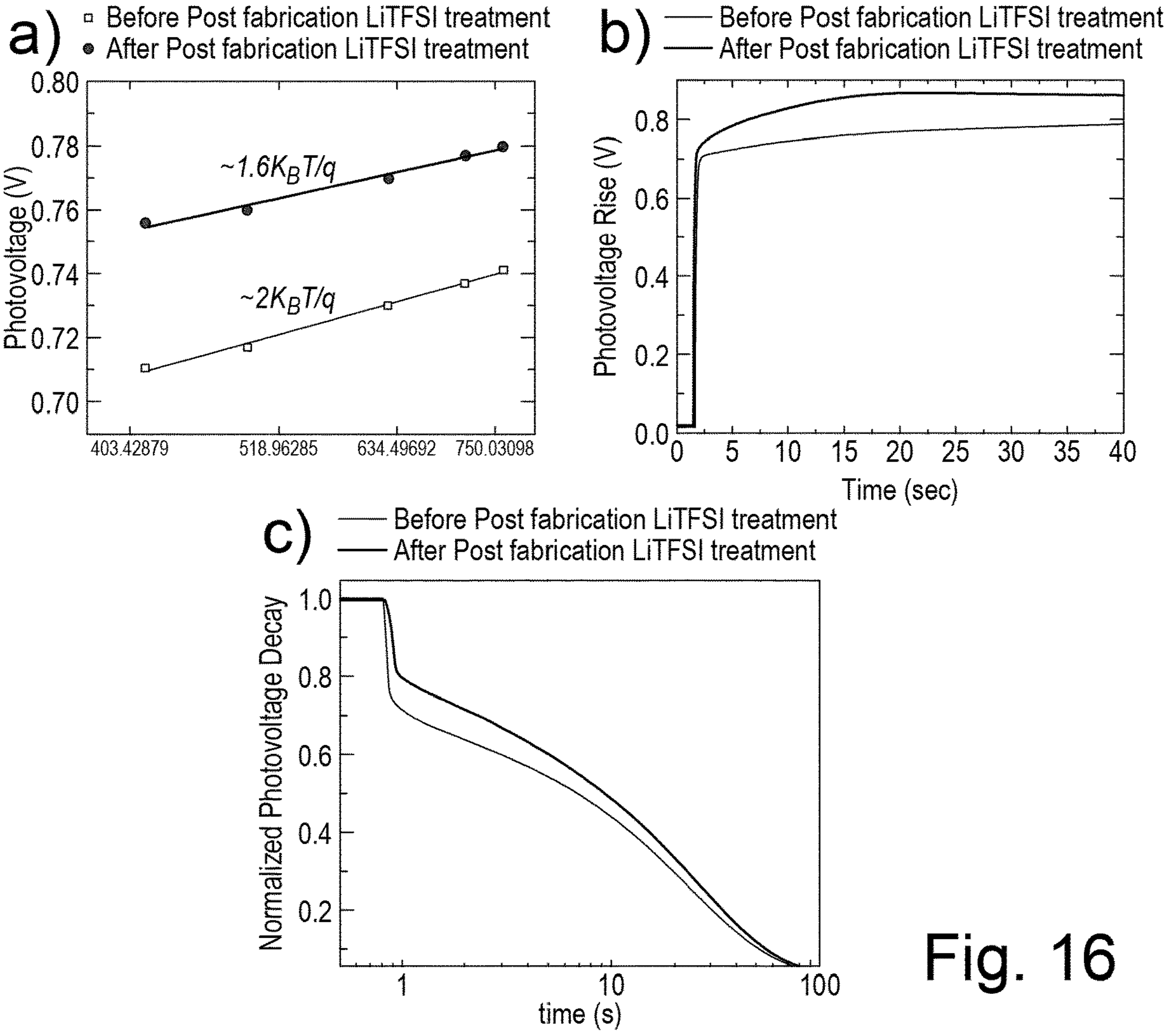
FIG. 16 shows (a) photovoltage vs light Intensity, (b) photovoltage rise and (c) normalized photovoltage decay of devices fabricated according to the present invention before and after post-fabrication LiTFSI treatment.

FIG. 16*a* shows a comparison of measured photovoltage response vs light intensity for devices before and after the post-fabrication LiTFSI treatment. An increased photovoltage is observed for LiTFSI treated devices across the different light intensities and an improved ideality factor is obtained (~1.6 for LiTFSI treated cells compared with ~2 for untreated cells) for the respective solar cells following the post-fabrication LiTFSI treatment. Without wishing to be bound by theory, this may indicate reduced trap-assisted recombination at the interfaces. In particular, trap-assisted recombination may be reduced at the interface between the perovskite active layer and the first charge transportation layer, and at the interface between the first charge transportation layer and the interlayer and/or the first electrode.

FIG. 16*b* shows a higher photovoltage and its faster rise for the devices treated with LiTFSI solution. This may indicate faster charge carrier extraction at the respective selective contacts. FIG. 16*c* shows a slower decay (longer lifetime) of the photovoltage for the LiTFSI treated devices, which may further indicate reduced recombination at the interfaces and increased carrier lifetimes.

Without wishing to be bound by theory, the reduced recombination at the interfaces and faster charge carrier extraction observed in devices fabricated according to the present invention may be due to improved interfacial contact between the respective layers of the device. For example, the post-fabrication treatment with LiTFSI may reduce the presence of gaps between layers at a given interface.

Further experiments performed on devices with different interfacial designs show that the post-fabrication LiTFSI treatment is universally applicable for improving the PCE of any fully printable solar cell architecture with printable counter electrodes according to the present invention.

REFERENCES 1 https://www.nrel.gov/pv/cell-efficiency.html
2 https://www.oxfordpv.com/news/oxford-pv-perovskite-solar-cell-achieves-28-efficiency.
3 T. Leijtens, G. E. Eperon, N. K. Noel, S. N. Habisreutinger, A. Petrozza, H. J. Snaith, Adv. Energy Mater., 2015, 5, 1500963.
4 K. Domanski, J.-P. Correa-Baena, N. Mine, M. K. Nazeeruddin, A. Abate, M. Saliba, W. Tress, A. Hagfeldt, M. Gratzel, ACS Nano, 2016, 10, 6306-6314.
5 R. Cheacharoen, C. C. Boyd, G. F. Burkhard, T. Leijtens, J. A. Raiford, K. A. Bush, S. F. Bent, M. D. McGehee, Sustainable Energy Fuels, 2018, 2, 2398-2406.
6 R. Cheacharoen, N. Rolston, D. Harwood, K. A. Bush, R. H. Dauskardt, M. D. McGehee, Energy Environ. Sci., 2018, 11, 144-150.
7 N. Arora, M. I. Darl, A. Hinderhofer, N. Pellet, F. Schreiber, S. M. Zakeeruddin, M. Grätzel, Science, 2017, 358, 768-771.
8 Z. Wang, Q. Lin, F. P. Chmiel, N. Sakai, L. M. Herz, H. J. Snaith, Nat. Energy, 2017,
9 G. Kakavelakis, I. Paradisanos, B. Paci, A. Generosi, M. Papachatzakis, T. Maksudov, L. Najafi, A. E. Castillo, G. Kioseoglou, E. Stratakis, F. Bonaccorso, E. Kymakis, Adv. Energy Mater., 2018, 8, 1702287.
10 A. Mei, X. Li, L. Liu, Z. Ku, T. Liu, Y. Rong, M. Xu, M. Hu, J. Chen, Y. Yang, M. Grätzel, H. Han, Science, 2014, 345, 295-298.
11 G. Grancini, C. Roldán-Carmona, I. Zimmermann, E. Mosconi, X. Lee, D. Martineau, S. Narbey, F. Oswald, F. De Angelis, M. Graetzel, M. K. Nazeeruddin, Nat. Commun. 2017, 8, 15684.
12 F. Machui, S. Langner, X. Zhu, S. Abbott, C. J. Brabec, Solar Energy Materials and Solar Cells, 2012, 100, 138-146
13 P. Zhou, T. Bu, S. Shi, L. Li, Y. Zhang, Z. Ku, Y. Peng, J. Zhong, Y.-B. Cheng, F. Huang, J. Mater. Chem. C, 2018, 6, 5733-5737
14 CN109216554A, CN103794374A, U.S. Pat. No. 9,718,972 B2
15 P. G. Karagiannidis, S. A. Hodge, L. Lombardi, F. Tomarchio, N. Decorde, S. Milana, I. Goykhman, Y. Su, S. V. Mesite, D. N. Johnstone, R. K. Leary, P. A. Midgley, N. M. Pugno, F. Torrisi, A. C. Ferrari, ACS Nano, 2017, 11, 2742-2755.
16 F. Giordano, A. Abate, J. P. Correa Baena, M. Saliba, T. Matsui, S. H. Im, S. M. Zakeeruddin, M. K. Nazeeruddin, A. Hagfeldt, M. Graetzel, Nat. Commun. 2016, 7, 10379.

17 M. Saliba, T. Matsui, J.-Y. Seo, K. Domanski, J.-P. Correa-Baena, M. K. Nazeeruddin, S. M. Zakeeruddin, W. Tress, A. Abate, A. Hagfeldt, M. Gratzel, Energy Environ. Sci. 2016, 9, 1989.

18 T. S. Sherkar, C. Momblona, L. Gil-Escrig, J. Avila, M. Sessolo, H. J. Bolink, L. J. A. Koster, ACS Energy Lett. 2017, 2, 5, 1214-1222.

19 Tingwei He, Saisai Li, Yuanzhi Jiang, Chaochao Qin, Minghuan Cui, Lu Qiao, Hongyu Xu, Jien Yang, Run Long, Huanhua Wang & Mingjian Yuan, NATURE COMMUNICATIONS |(2020) 11:1672| doi.org/10.1038/s41467-020-15451-1.

20 Zhang et al ACS Appl. Mater. Interfaces 2020, 12, 30, 33751-33758.

The invention claimed is:

1. A semiconductor device comprising:

a first electrode comprising a conductive material, wherein the conductive material is deposited by ink deposition, or wherein the conductive material comprises CVD grown graphene or carbon nanotubes;

a first charge transportation layer, wherein the first charge transportation layer is doped from 0.1 to 3% with the conductive material of the first electrode;

an optional first insulation layer;

a perovskite active layer;

an optional second insulation layer;

a second charge transportation layer;

and a second electrode.

2. The semiconductor device according to claim 1, further comprising an interlayer between the first electrode and the first charge transportation layer.

3. The semiconductor device according to claim 2, wherein the interlayer comprises a conductive material or an ultrathin insulating film.

4. The semiconductor device according to claim 2, wherein the interlayer is deposited by a printable conductive ink, comprising conductive material(s) and solvent(s).

5. The semiconductor device according to claim 1, wherein the first electrode is deposited by a printable conductive ink, comprising conductive material(s) and solvent(s).

6. The semiconductor device according to claim 5, wherein the conductive material(s) are layered materials including graphene, graphene/graphite, graphite and MXenes, or wherein the conductive material(s) are carbon black, carbon/graphite, graphite and carbon nanotubes, or wherein the conductive material(s) are metal inks, for example nanowire inks, including silver and copper inks.

7. The semiconductor device according to claim 1, wherein the first electrode is deposited by CVD and the conductive material is (CVD) grown nanomaterials including graphene or carbon nanotubes.

8. The semiconductor device according to claim 1, wherein the first electrode is a first nanoplate electrode.

9. The semiconductor device according to claim 1, wherein the first charge transportation layer is a hole transporting organic semiconducting material selected from the group consisting of PEDOT:PSS, PANI (polyaniline), polypyrrole, doped poly(ethylene dioxythiophene) (PEDOT), (poly[bis(4-phenyl)(2,4,6-trimethylphenyl)amine]) (PTAA), copper thiocyanate (CuSCN), benzodithiophene (BDT) based polymer, poly(p-phenylene) (PPP), lead phthalocyanine (PbPc), poly(9,9-dioctylfluorene-co-N-(4-(3-methylpropyl))diphenylamine) (TFB), polythiophene (PT), poly(4,4'-bis(N-carbazolyl)-1,1'-biphenyl) (PPN), nickel oxide (NiO), copper iodide (CuI), CuInS2 quantum dots, ternary oxide: $Li_{0.05}$ $Mg_{0.15}$ $Ni_{0.8}$ O, spiro OMeTAD, triazatruxene, PCP-TPA, polyfluorenes F8, TFB, PFB, or F8-TFB, polycarbazole, 4,4'-Bis(N-carbazolyl)-1,1'-biphenyl, 4,4'-Bis(N-carbazolyl)-1,1'-biphenyl, poly(3-hexylthiophene-2,5-diyl) (P3HT), and poly[(4,4'-bis(2-butyloctoxycarbonyl-[2,2'-bithiophene]-5,5-diyl)-alt-(2,2'-bithiophene-5,5'-diyl) (PDCBT).

10. The semiconductor device according to claim 1, wherein the first charge transportation layer is doped from 0.5 to 3% with the conductive material of the first electrode.

11. The semiconductor device according to claim 1, wherein the perovskite is a metal halide perovskite or metal-metal halide perovskite has an $AMX_3$ structure, where A is a monovalent cation, M is a divalent cation and X is a halide anion.

12. The semiconductor device according to claim 11, wherein A may be:

a monovalent organic cation or a monovalent metal cation;

dual cationic with an $A_{1-i}B_i$ structure, with A and B being different and are each a monovalent organic cation or monovalent metal cation, and i is between 0 and 1;

triple cationic with an $A_\alpha B_\beta C_\gamma$ structure, with A, B and C being different and are each a monovalent organic cation or monovalent metal cation, and α, β and γ combined equal 1; or quadruple cationic with an $A_\alpha B_\beta C_\gamma D_\gamma$ structure, wherein: A, B, C and D are each a monovalent organic cation or monovalent metal cation, where A, B, C and D are different; and α, β, γ and δ combined equal 1.

13. The semiconductor device according to claim 11, wherein M may be:

a divalent cation;

have the structure $M_{1-j}N_j$ wherein M and N are each a divalent metal cation; and j is between 0 and 1; or have the structure $M_\varepsilon N_\zeta O_\eta$ structure, wherein: M, N and O are each a divalent metal cation, where M, N and O are different; and ε, ζ and η combined equal 1.

14. The semiconductor device according to claim 11, wherein $X_3$ may be:

a halide anion;

have the structure $X_{3-k}Y_k$, wherein X and Y are each a halide anion, where X and Y are different, and k is between 0 and 3; or have the structure $X_\alpha Y_\beta Z_\gamma$ structure, wherein: X, Y and Z are each a halide anion, where A, B and C are different; and α, β and γ combined equal 1.

15. The semiconductor device according to claim 10, wherein the monovalent cation(s) is/are an alkali metal cation.

16. The semiconductor device according to claim 1 comprising a first insulation layer, wherein the first insulating layer is formed of an insulating polymer selected from the group consisting of poly(ethyleneimine) (PEI), polyethylenimine-ethoxylated (PEIE), polystyrene (PS), poly(methylmethacrylate) (PMMA), or wherein the first insulating layer is formed of an organic halide salt selected from the group consisting of phenethylammonium iodide (PEAI), Guanidinium iodide (GuI) Guanidinium bromide (GuBr), n-Butylamonium iodide (BAI), n-Butylammonium bromide (n-BABr) and ethylenediammonium diiodide ($EDAI_2$).

17. The semiconductor device according to claim 16, wherein the insulating layer(s) is/are deposited by atomic layer deposition (ALD), spin coating or thermal evaporation.

18. The semiconductor device according to claim 1, wherein one or more metal salt(s) with electron accepting (p-type doping) properties is present at one or more interfaces between layers of the semiconductor device.

19. The semiconductor device according to claim 18, wherein said metal salt(s) is a lithium metal salt, a cobalt metal salt, a copper metal salt; a silver metal salt; or an iron metal salt; said lithium metal salt(s) optionally being selected from bis(trifluoromethane)sulfonimide lithium (LiTFSI) salt; said cobalt metal salt(s) optionally being selected from tris(2-(1H-pyrazol-1-yl)pyridine)cobalt(III) (FK102), tris(2-(1H-pyrazol-1-yl)-4-tert-butylpyridine)cobalt(III) tri[hexafluorophosphate](FK209) and bis(2,6-di (1H-pyrazol-1-yl)pyridine)cobalt(III)tris(bis(trifluoromethylsulfonyl)imide) (FK269), tris[2-(1H-pyrazol-1yl) pyrimidine]cobalt(III) tri[bis(trifluoromethylsulfonyl) imide](MY11), and bipyridine cobalt complexes; said copper metal salt(s) optionally being selected from CuI, CuSCN, copper(II)-pyridine complexes including bis[di (pyridin-2-yl)methane]copper(II) bis[bis(trifluoromethylsulfonyl) imide][$Cu(bpm)_2$] and bis[2,2'-(chloromethylene)-dipyridine]copper(II) bis[bis(trifluoromethylsulfonyl) imide][$Cu(bpcm)_2$], and $Cu(bpcm)_2$; said silver metal salt(s) optionally being selected from AgTFSI; said iron metal salt(s) optionally being selected from $FeCl_3$.

20. A solar cell or light emitting device comprising a semiconductor device according to claim 1.

21. A method of making the semiconductor device according to claim 1, the method comprising forming the first electrode by applying a printable conductive ink comprising the conductive material dispersed in a solvent to the device, wherein the solvent is selected from IPA, ethanol, and ethyl acetate.

22. A method of making the semiconductor device according to claim 1, the method comprising doping the first charge transportation layer with the same conductive material in the first electrode.

23. The method according to claim 21, wherein the first electrode comprises a nanoplate material and the first charge transportation layer is doped with said nanoplate material.

24. The method according to claim 22, wherein the first electrode comprises a nanoplate material and the first charge transportation layer is doped with said nanoplate material.

* * * * *